(12) United States Patent
Kwon et al.

(10) Patent No.: US 8,587,045 B2
(45) Date of Patent: Nov. 19, 2013

(54) NONVOLATILE MEMORY DEVICE AND METHOD OF FORMING THE SAME

(75) Inventors: Oh-Kyum Kwon, Suwon-si (KR);
Tae-Jung Lee, Yongin-si (KR);
Kyoung-Eun Uhn, Incheon (KR);
Byung-Sun Kim, Suwon-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 13/181,700

(22) Filed: Jul. 13, 2011

(65) Prior Publication Data

US 2012/0037971 A1  Feb. 16, 2012

(30) Foreign Application Priority Data

Aug. 13, 2010  (KR) .................. 10-2010-0078475
Aug. 13, 2010  (KR) .................. 10-2010-0078477

(51) Int. Cl.
*H01L 27/108* (2006.01)
*H01L 29/94* (2006.01)

(52) U.S. Cl.
USPC ......................... 257/296; 257/300; 257/379

(58) Field of Classification Search
USPC .................... 257/301, 296, 300, 379
See application file for complete search history.

(56) References Cited

U.S. PATENT DOCUMENTS

| 4,658,283 | A | * | 4/1987 | Koyama | 257/297 |
| 4,683,486 | A | * | 7/1987 | Chatterjee | 257/68 |
| 4,794,434 | A | * | 12/1988 | Pelley, III | 257/301 |
| RE33,261 | E | * | 7/1990 | Baglee et al. | 257/301 |
| 5,049,959 | A | * | 9/1991 | Satoh | 257/301 |
| 5,187,566 | A | * | 2/1993 | Yoshikawa et al. | 257/301 |
| 6,093,946 | A | | 7/2000 | Li et al. | |
| 6,097,069 | A | | 8/2000 | Brown et al. | |
| 6,452,835 | B1 | * | 9/2002 | Diorio et al. | 365/185.03 |
| 6,815,757 | B2 | * | 11/2004 | Adams et al. | 257/315 |
| 6,965,142 | B2 | * | 11/2005 | Diorio et al. | 257/315 |
| 7,482,223 | B2 | | 1/2009 | Higashitani et al. | |
| 7,714,370 | B2 | * | 5/2010 | Kurachi | 257/298 |
| 7,800,156 | B2 | * | 9/2010 | Roizin et al. | 257/315 |
| 7,859,043 | B2 | * | 12/2010 | Pikhay et al. | 257/315 |
| 8,102,007 | B1 | * | 1/2012 | Hyde et al. | 257/371 |
| 8,138,537 | B2 | * | 3/2012 | Sato | 257/296 |
| 8,198,662 | B2 | * | 6/2012 | Nagao | 257/298 |
| 2004/0021166 | A1 | * | 2/2004 | Hyde et al. | 257/314 |
| 2004/0211994 | A1 | * | 10/2004 | Ueda et al. | 257/288 |
| 2005/0030702 | A1 | * | 2/2005 | Diorio et al. | 361/328 |
| 2005/0035411 | A1 | * | 2/2005 | Hasegawa et al. | 257/369 |
| 2006/0170044 | A1 | * | 8/2006 | Tu | 257/347 |
| 2006/0270083 | A1 | * | 11/2006 | Yamasaki | 438/29 |

(Continued)

FOREIGN PATENT DOCUMENTS

| KR | 100147643 B1 | 5/1998 |
| KR | 100284307 B1 | 12/2000 |
| KR | 1020050069644 A | 7/2005 |

(Continued)

*Primary Examiner* — Ngan Ngo
(74) *Attorney, Agent, or Firm* — Volentine & Whitt, PLLC

(57) ABSTRACT

A nonvolatile memory device has a first active region and a second active region defined in a substrate by a device isolation layer, a Metal Oxide Silicon Field-Effect Transistor (MOSFET) disposed on the first active region and including a first electrode pattern, and a Metal Oxide Silicon (MOS) capacitor disposed on the second active region and including a second electrode pattern, and in which the first electrode pattern is narrower in the widthwise direction of the channel of the MOSFET than the first active region.

5 Claims, 38 Drawing Sheets

(56) References Cited

U.S. PATENT DOCUMENTS

2009/0065838 A1* 3/2009 Nagao ............................ 257/298
2010/0009466 A1* 1/2010 Nagai ................................ 438/3
2010/0038693 A1* 2/2010 Shiba et al. .................... 257/298
2010/0120226 A1* 5/2010 Yamazaki et al. ............. 438/458

FOREIGN PATENT DOCUMENTS

| KR | 1020060080457 A | 7/2006 |
|----|-----------------|--------|
| KR | 1020060123856 A | 12/2006 |
| KR | 100688585 B1 | 2/2007 |
| KR | 1020090070344 A | 7/2009 |

* cited by examiner

US 8,587,045 B2

NONVOLATILE MEMORY DEVICE AND METHOD OF FORMING THE SAME

PRIORITY STATEMENT

This U.S. non-provisional patent application claims priority under 35 U.S.C. §119 of Korean Patent Application Nos. 10-2010-0078475, filed on Aug. 13, 2010, and 10-2010-0078477, filed on Aug. 13, 2010.

BACKGROUND

The inventive concept relates to a nonvolatile memory device and to a method of forming the same.

Semiconductor memory devices may be classified as volatile and nonvolatile memory devices. A nonvolatile memory device retains stored data even if the power supplied thereto is cut off Nonvolatile memory devices include Programmable ROMs (PROMs), Erasable PROMs (EPROMs), Electrically EPROMs (EEPROMs), and flash memory devices. EEPROMs are widely used in mobile Display Driver ICs (DDIs), for example.

A System On Chip (SOC) in which a logic device and a memory device are realized in one chip has recently been developed as a core component of digital technology. If a SOC has an EEPROM as a memory device, the logic device and EEPROM of the SOC are manufactured contemporaneously.

SUMMARY

According to one aspect of the inventive concept there is provided a semiconductor memory device comprising a substrate, a device isolation layer delimiting a first active region and a second active region in the substrate, a Metal Oxide Silicon Field-Effect Transistor (MOSFET) disposed at the first active region and including a first electrode pattern, and a Metal Oxide Silicon (MOS) capacitor disposed at the second active region and including a second electrode pattern, wherein the first electrode pattern is narrower, in the widthwise direction of the channel of the MOSFET, than the first active region.

According to another aspect of the inventive concept there is provided a method of forming a nonvolatile memory device, the method comprising forming a device isolation layer to define a first active region and a second active region, forming an insulation layer on the substrate, forming a conductive layer on the insulation layer, and patterning the conductive layer to form a first electrode pattern having sidewalls extending upright on the first active region, and a second electrode pattern on the second active region.

According to another aspect of the inventive concept there is provided a semiconductor memory device comprising a substrate, a first device isolation layer delimiting a first active region and a second active region in the substrate, a Metal Oxide Silicon Field-Effect Transistor (MOSFET) disposed at the first active region and including a first electrode pattern, a Metal Oxide Silicon (MOS) capacitor disposed at the second active region and including a second electrode pattern electrically connected to the first electrode pattern, and a second device isolation layer disposed in the substrate below the second electrode pattern.

According to another aspect of the inventive concept there is provided a method of forming a nonvolatile memory device, the method comprising forming a device isolation layer to delimit a first active region in a substrate and a second active region having a plurality of active sections spaced from each other by the device isolation layer in at least a first direction, and forming a first electrode pattern on the first active region and a second electrode pattern on the second active region wherein the first and second electrode patterns are electrically connected.

According to another aspect of the inventive concept there is provided a method of fabricating a nonvolatile memory device, the method comprising forming a device isolation layer to define a first active region and a second active region in a substrate, forming an insulation layer on the substrate including over the first and second active regions and the device isolation layer, patterning the insulation layer to expose an upper surface of the second active region extending between upper edges of the device isolation layer spaced from each other in a first direction and to form a window that exposes a portion of the upper surface of the first active region. At this time, the patterning selectively forms indentations in said upper edges of the device isolations layer, the indentations confronting exposed upper surface of the second active region. Then, a capacitor insulation layer is formed on the exposed upper surface of the second active region such that the a first portion of the capacitor insulation confronted by the indentations in the device isolation layer is thinner than a remaining portion of the device isolation layer, and a tunnel insulation layer is formed in the window that exposes a portion of the upper surface of the active region. In this case, the tunnel insulation layer has a uniform thickness. Finally, a first electrode pattern is formed on the tunnel insulation layer, and a second electrode pattern is formed over the capacitor insulation layer and on the device isolation layer such that the second electrode pattern has opposite sidewalls extending upright on the device isolation layer.

BRIEF DESCRIPTION OF THE DRAWINGS

The above and other aspects and features of the inventive concepts will become apparent from the detailed description that follows, with reference to the accompanying drawings, in which:

FIGS. 7 through 12 are sectional views illustrating a method of forming the first embodiment of a semiconductor memory device, according to the inventive concept, wherein FIGS. 7, 9, and 11 are sectional views taken in the direction of line A-A' of FIG. 2 and FIGS. 8, 10, and 12 are sectional views taken in the direction of line B-B' of FIG. 2;

FIGS. 20 through 29 illustrate a method of forming the third embodiment of a semiconductor memory device, according to the inventive concept, wherein FIGS. 20, 22, 24, 26, and 28 are plan views of the method of forming the MOS capacitor of the device shown in FIGS. 16-19 and FIGS. 21, 23, 25, 27, and 29 are sectional views taken along lines L-L' of FIGS. 20, 22, 24, 26, and 28, respectively;

FIGS. 35-42 illustrate a method of forming the fourth embodiment of a semiconductor memory device, according to the inventive concept, wherein FIGS. 35, 37, 39 and 41 are plan views, and FIGS. 36, 38, 40 and 42 are sectional views take along lines 0'-0 of FIGS. 35, 37, 39 and 41, respectively;

DETAILED DESCRIPTION OF THE EMBODIMENTS

Figure 1:
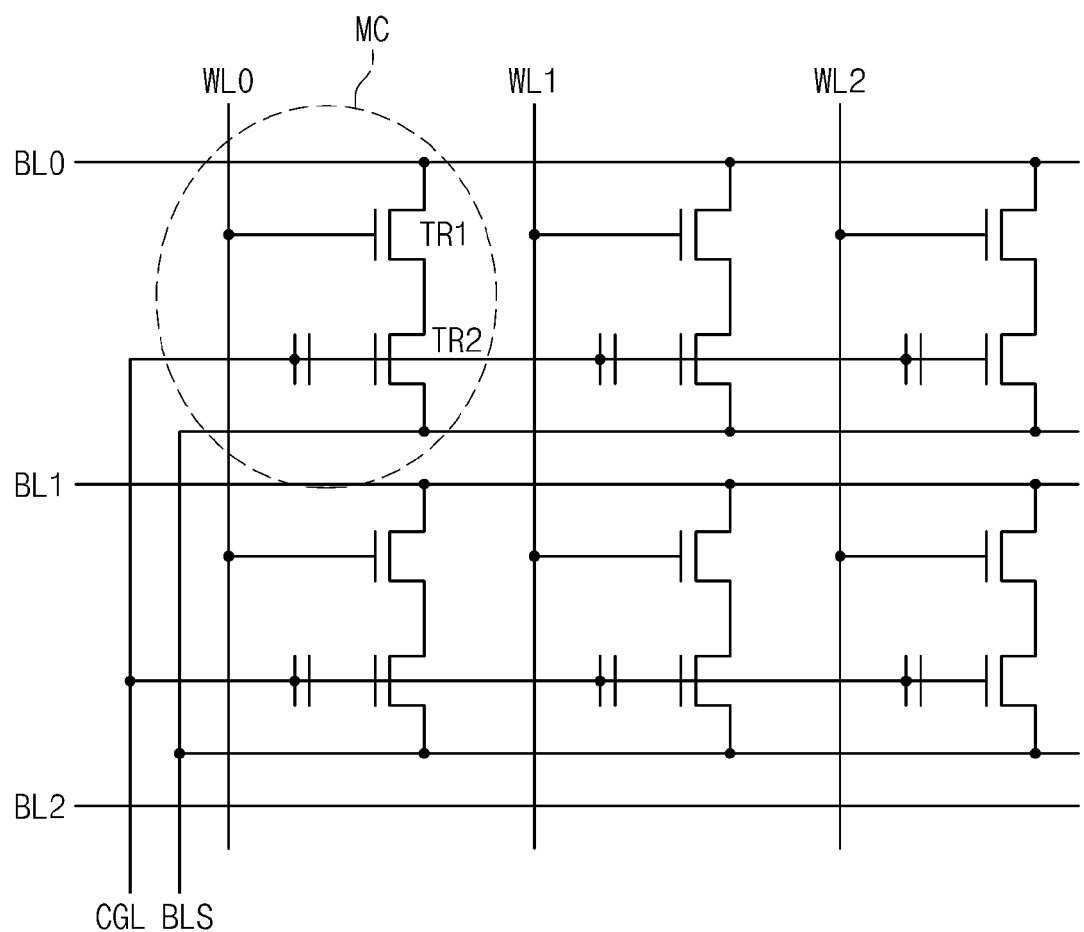
FIG. 1 is a circuit diagram of a memory cell array of a semiconductor memory device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, it will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term lengthwise direction of the channel Referring to FIG. 1, a memory cell array of a nonvolatile memory device according the inventive concept includes bit lines BL0 to BL2, word lines WL0 to WL2, common bit line selection lines BLS, and a plurality of memory cells MC operatively interposed between the bit lines BL0 to BL2 and the common bit line selection lines BLS. Each memory cell MC includes a first transistor TR1 and a second transistor TR2, which are connected in series. The first transistor TR1 may be referred to as a selection transistor because the transistor TR1, based on the voltages applied to the bit lines BL0 to BL2 and the word lines WL0 to WL2, serves to select which of write, read, and erase operations is performed in the memory cell MC. The second transistor TR2 is connected to a control gate line CGS and the common bit line selection lines BLS. The second transistor TR2 may be referred to as an access transistor because the transistor TR2 controls the access to the memory cell MC during a write or read operation. The second transistor TR2 includes a control gate and a floating gate. The floating gate is the information storage component of the memory cell MC.

A memory device, i.e., one of the memory cells MC, according to the inventive concept will now be described in more detail with reference to FIGS. 2 through 6.

Figure 2:
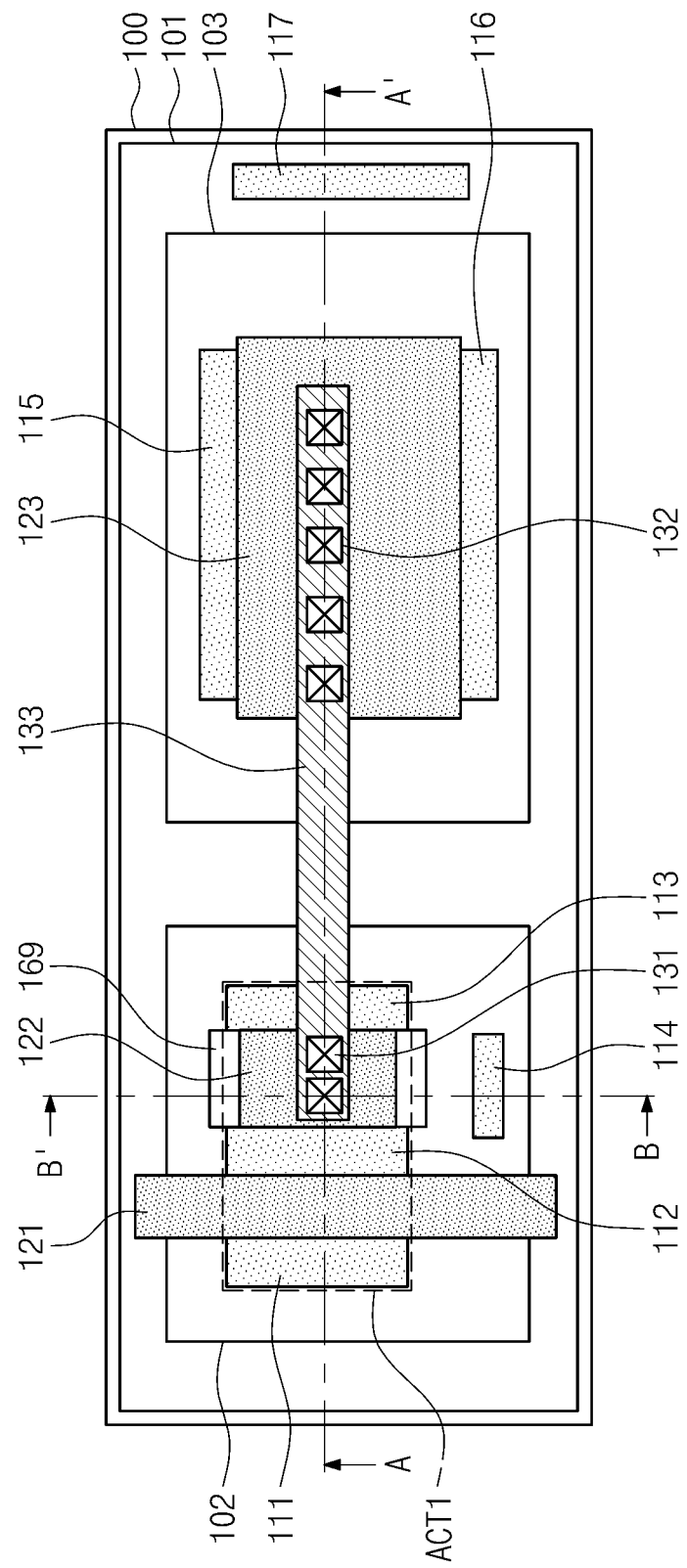
FIG. 2 is a plan view of a first embodiment of the memory device according to the inventive concept.
Figure 3:
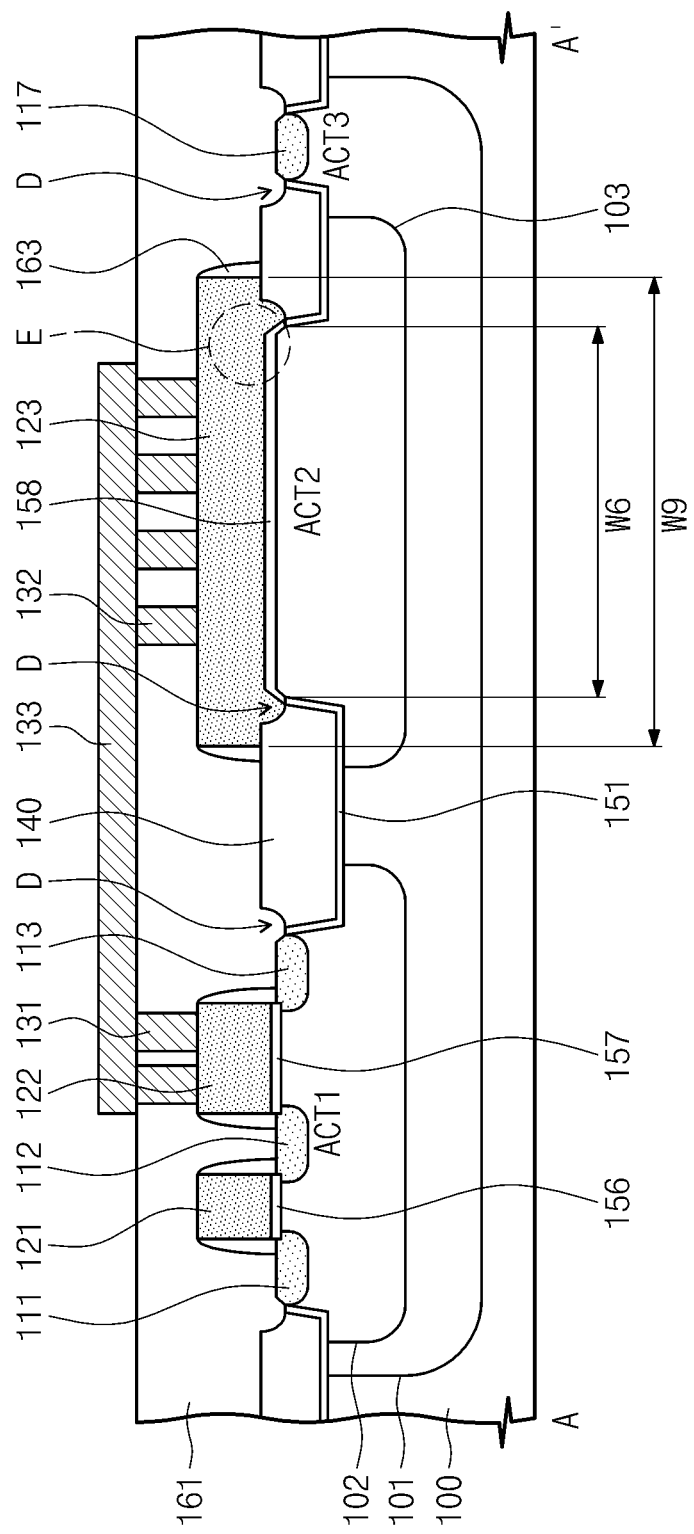
FIG. 3 is a sectional view taken along line A-A' of FIG. 2.
Figure 4:
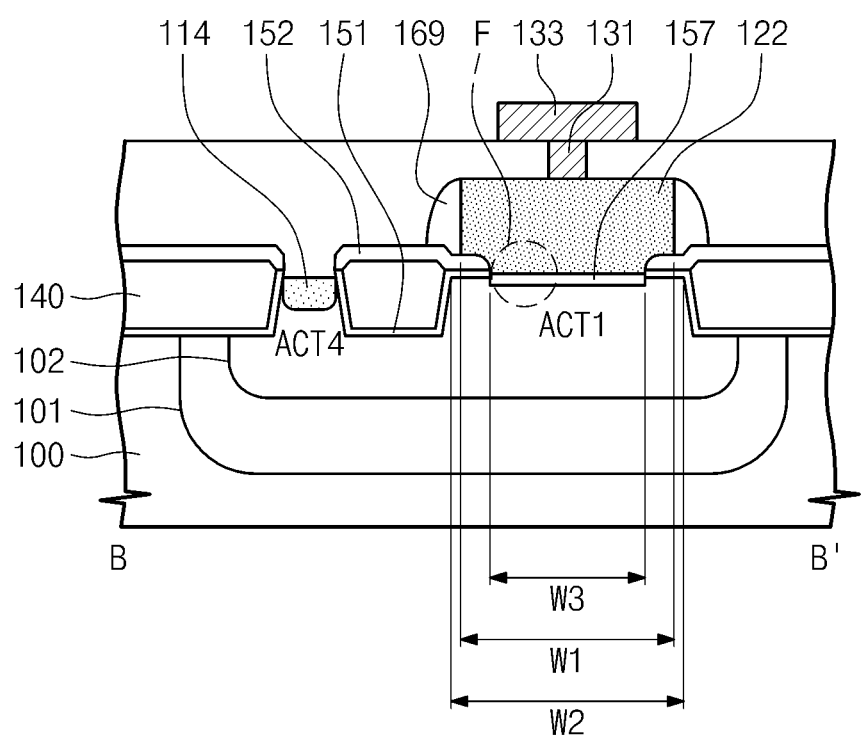
FIG. 4 is a sectional view taken along line B-B' of FIG. 2.

Referring first, though, to FIGS. 2 through 4, the memory device has a substrate 100. The substrate 100 may be a silicon substrate, a germanium substrate, or a silicon-germanium substrate. The substrate 100 may be doped with a first type impurity, e.g., a p-type impurity. In this case, a first well 101 comprising a region doped with a second type impurity, e.g., an n-type impurity, may be provided in the substrate 100. The substrate 100 may include a second well 102 and a third well 103 formed inside the first well 101. That is, the second and third wells 102 and 103 may be a pocket wells. The second well 102 and the third well 103 may be spaced from each other. The second and third wells 102 and 103 would be regions doped with the first type impurity.

A device isolation layer 140 is disposed in the substrate 100 to define a first active region ACT 1, a second active region ACT2, a third active region ACT3, and a fourth active region ACT4 of the substrate 100. The first active region ACT1 and the fourth active region ACT4 are defined in the second well 102, and the second active region ACT2 is defined in the third well 103. The third active region ACT3 is defined outside the second and third wells 102 and 103. The device isolation layer 140 may be a silicon oxide layer, and is preferably a silicon oxide layer formed by a high density plasma chemical vapor deposition method so as to possess an excellent gap-filling characteristic.

A liner insulation layer 151 may be interposed between the device isolation layer 140 and the substrate 100. An example of the liner insulation layer 151 is an oxide layer formed by a thermal oxidation process.

A Metal Oxide Silicon Field-Effect Transistor (MOSFET) including a first electrode pattern 122 and a tunnel insulation layer 157 is provided on the first active region ACT1. A Metal Oxide Silicon (MOS) capacitor including a second electrode pattern 123 and a capacitor insulation layer 158 is provided on the second active region ACT2. The first and second electrode patterns 122 and 123 may be formed of polysilicon. The tunnel insulation layer 157 and the capacitor insulation layer 158 may be constituted by a thermal oxide layer. Bottom surfaces of the tunnel insulation layer 157 and the capacitor insulation layer 158 may be disposed at a level beneath that of the top surface of the substrate 100.

The first and second electrode patterns 122 and 123 are electrically connected through a conductive line 133 and first and second vias 131 and 132 connected to the conductive line 133. More specifically, the first and second vias 131 and 132 extend through an interlayer insulation layer 161 on the substrate 100 and each first via 131 is provided on and contacts the first electrode pattern 122 whereas each second via 132 is provided on and contacts the second electrode pattern 123. The conductive line 133 is disposed on the interlayer insulation layer 161 and the first and second vias 131 and 132 extend from the conductive line 133. The first and second vias 131 and 132 and the conductive line 133 may be of at least one material selected from the group consisting of metals, metal silicides, conductive metal nitrides, and doped semiconductor material.

A unit cell of a typical EEPROM has a stacked gate structure including a floating gate and a control gate. Thus, such a floating gate and control gate must be formed by separate processes. Logic devices, on the other hand, typically adopt a transistor having a single gate structure. Accordingly, fabricating an (SOC) that employs an EEPROM is a relatively complex process.

To minimize the complexity, the first embodiment of a semiconductor device according to the inventive concept comprises a memory device whose unit cells have a single gate structure. In this example of a semiconductor device according to the inventive concept, the first and second electrode patterns 122 and 123, the first and second vias 131 and 132, and the conductive line 133 constitute a floating gate of a unit cell of the memory device, and the third well 103 constitutes a control gate of the unit cell.

Referring still to FIGS. 2-4, a gate insulation layer 156 and a third electrode pattern 121 are provided on the first active region ACT1, as spaced from the first electrode pattern 122. The third electrode pattern 121 may be connected to a word line of the memory device. Accordingly, the third electrode pattern 121 may be a gate electrode of a selection transistor. Furthermore, the third electrode pattern 121 may extend in the width-wise direction of the channel below the gate insulation layer 156 so as to facilitate its connection to an adjacent memory cell.

In addition, spacers 163 may be provided on sidewalls of the electrode patterns 121 to 123.

A first impurity region 111, a second impurity region 112, and a third impurity region 113 may be provided in the first active region ACT 1. The first impurity region 111 and the third impurity region 113 may be provided below a sidewall of the third electrode pattern 121 and below a sidewall of the first electrode pattern 122, respectively. The second impurity region 112 may be provided between the first and third electrode patterns 122 and 121. The first impurity region 111 may be connected to the bit lines BL. The third impurity region 113 may be connected to the common bit line selection lines BLS. The first to third impurity regions 111 to 113 are doped regions of a conductivity type different than that of the second well 102. That is, in this example, the first to third impurity regions 111 to 113 are of the second conductivity type.

A fourth impurity region 114 is provided in the fourth active region ACT4. The fourth impurity region 114 is an impurity region by which an erase voltage $V_{ERS}$ can be applied to the second well 102. In this respect, the fourth impurity region 114 is a doped region of the same conductivity type as the second well 102. Thus, in the present example, the fourth impurity region 114 is of the first conductivity type but has a higher dopant concentration than the second well 102.

Also, in the illustrated example of this embodiment, a fifth impurity region 115 and a sixth impurity region 116 are provided in the second active region ACT2, although only one of the fifth and sixth impurity regions 115 and 116 may be provided. The fifth and sixth impurity regions 115 and 116 are provided below sidewalls of the second electrode pattern 123, respectively. The fifth and sixth impurity regions 115 and 116 are impurity regions by which a control gate voltage VCG can be applied to the second active region ACT2. In this respect, the fifth and sixth impurity regions 115 and 116 are doped regions of different conductivity types.

A seventh impurity region 117 is provided in the third active region ACT3. The seventh impurity region 117 is a region by which a voltage can be applied to the first well 101. The seventh impurity region 117 may be a region doped with an impurity of the same conductivity type as the first well 101. Thus, in this example, the seventh impurity region 117 may be a region doped with the second type impurity. The seventh impurity region 117 may have a higher doping concentration than the first well 101. The seventh impurity region 117 may be formed in a plurality of segments, unlike the region shown the drawings. Furthermore, the seventh impurity region 117 also may be provided between the second well 102 and the third well 103.

A silicide layer (not shown) may be provided on the first to seventh impurity regions 111 to 117. For example, a cobalt silicide layer may be provided on the first to seventh impurity regions 111 to 117.

Figure 5:
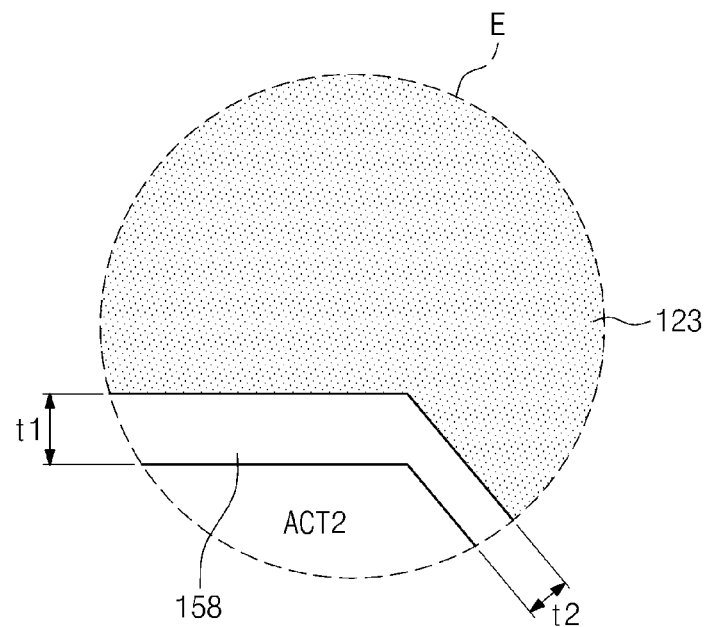
FIG. 5 is an enlarged view of portion E of the memory device in FIG. 3.

Referring to FIG. 3, indentations D are provided in the edges of the upper portions of the device isolation layer 140 spaced in the lengthwise direction of the channel below the tunnel insulation layer 157. That is, the lengthwise direction of the channel is parallel to line A-A' in FIG. 2. Accordingly, the widthwise direction of the channel refers to a direction parallel to line B-B'. The indentations D occur because a portion of a sidewall of the device isolation layer 140 is removed during a process of removing a first insulation layer 152 described below. An indentation D, when formed, exposes an upper part of the sidewall of the second active region ACT2. As shown in FIG. 5, the thickness (t2) of that part of the capacitor insulation layer 158 extending over the upper part of the sidewall is less than the thickness (t1) of that part of the capacitor insulation layer 158 extending over the upper surface of the second active region ACT2.

This difference in the thicknesses t1 and t2 may occur due to stress concentration when the indentation D is formed. More specifically, the upper part of the sidewall of the second active region ACT2 has a different crystallographic plane than the top surface of the second active region ACT2. When the capacitor insulation layer 158 is formed on the second active region ACT2, stress concentrations due to the different crystallographic planes alters the thickness of the capacitor insulation layer 158 at the indention D. The resulting difference in thicknesses t1 and t2 is known as edge thinning In this embodiment, the layer 158 serves to insulate the electrode pattern 123 in the MOS capacitor. The capacitance of the MOS capacitor is thus increased due to the edge thinning. Accordingly, the control gate voltage VCG applied to the memory cell and the area of the second electrode pattern 123 may be minimized, i.e., the scaling down of a chip comprising the semiconductor device is facilitated.

The dimension W9 of the second electrode pattern 123 in the lengthwise direction of channel may be greater than that W6 of the second active region ACT2. The dimension of the active region in this case is measured along the top surface of the region as delimited by the device isolation layer 140. In this case, capacitance is increased because all portions of the capacitor insulation layer 158 are effective in insulating the capacitor.

The first electrode pattern 122 is confined to the top of the first active region ACT1. As shown in FIG. 4, the dimension W1 of the first electrode pattern 122 in the widthwise direction of the channel is less than that W2 of the first active region ACT1. In this case, the effect of edge thinning on the MOSFET can be prevented. That is, even if indentations were present in the upper portions of the sidewalls of the device isolation layer 140 in the widthwise direction of the channel, the first electrode pattern 122 is narrow to prevent the first electrode pattern 122 from overlapping such indentations D. In particular, the first electrode pattern 122 is formed so that its sidewalls extend upright on the first active region ACT 1. The width W1 of the first electrode pattern 122 may be different from that of the second electrode pattern 123 because a separately formed conductive line 133 is used to connect them.

The first embodiment of the memory device according to the inventive concept performs a write/erase operation through Fowler-Nordheim tunneling of the tunnel insulation layer 157. The degree to which edge thinning occurs is affected by the crystallography of the device isolation layer and etching processes to which the layer is exposed. Accordingly, the degree to which edge thinning occurs may vary throughout a cell array, i.e., form memory cell to memory cell within the same wafer, or may vary among memory cells of different wafers fabricated using the same process. Furthermore, in any case, edge thinning of a tunnel insulation layer would greatly affect write/erase characteristics of the transistor comprising the tunnel insulation layer. Accordingly, edge thinning of tunnel insulation layers presents a threshold voltage scatter problem of creating significant variation in the threshold voltage between memory cells. On the other hand, the problems of threshold voltage scatter do not pertain to capacitors and so edge thinning of a capacitor insulation layer is not an issue. Accordingly, the first embodiment of the memory device according to the inventive concept increases the capacitance of the MOS capacitor and resolves the threshold voltage scatter problems associated with the MOSFET by selective use/creation of the edge thinning phenomenon.

Referring especially to FIGS. 2 and 4, a sidewall insulation layer 169 overlapping the first active region ACT1 and the device isolation layer 140 may be provided on sidewalls of the first electrode pattern 122. The sidewall insulation layer 169 may be an oxide layer, a nitride layer, or an oxide nitride layer. The sidewall insulation layer 169 may be formed together with spacers 163 or may be formed by a different process. The sidewall insulation layer 169 keeps the second impurity region 112 and the third impurity region 113 separated from each other during an impurity injection process in which the second and third impurity regions 112 and 113 are formed. As best shown in FIG. 4, the sidewall insulation layer 169 has the form of sidewall spacers.

Figure 6:
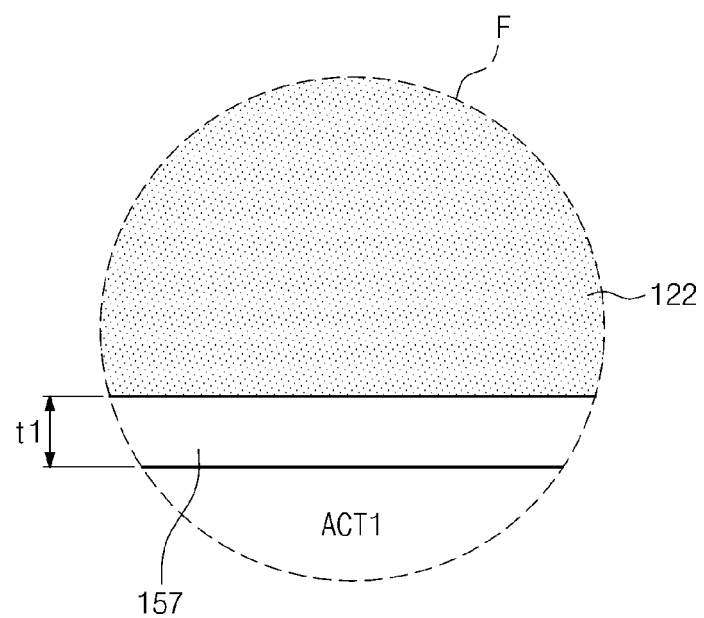
FIG. 6 is an enlarged view of portion F of the memory device in FIG. 4.

The dimension W3 of the tunnel insulation layer 157 in the widthwise direction of the channel may be less than that W1 of the first active region ACT1. The dimension W3 of the tunnel insulation layer 157 also may be less than that W2 of the first electrode pattern 122. That part of the first active region ACT1 which is not covered by the tunnel insulation layer 157 may be covered by the first insulation layer 152 and/or the liner insulation layer 151. That is, the width of the tunnel insulation layer 157 may be adjusted to allow the tunnel insulation layer 157 to be spaced from the device isolation layer 140. In this way, as shown in FIG. 6, the tunnel insulation layer 157 is not prone to the edge thinning phenomenon and thus, may have a uniform thickness t1. The first insulation layer 152 may be a buffer oxide layer for ion implantation used in a well process and/or an oxide layer used in a process of forming a logic device.

According to the first embodiment of the inventive concept, as described above, selective provision of edge thinning resolves the problem of threshold voltage scatter while offering a higher capacitance for a capacitor of the memory device.

A method of forming such a memory device will now be described with reference to FIGS. 7 through 12, according to a first embodiment of the inventive concept will be described.

Figure 7:
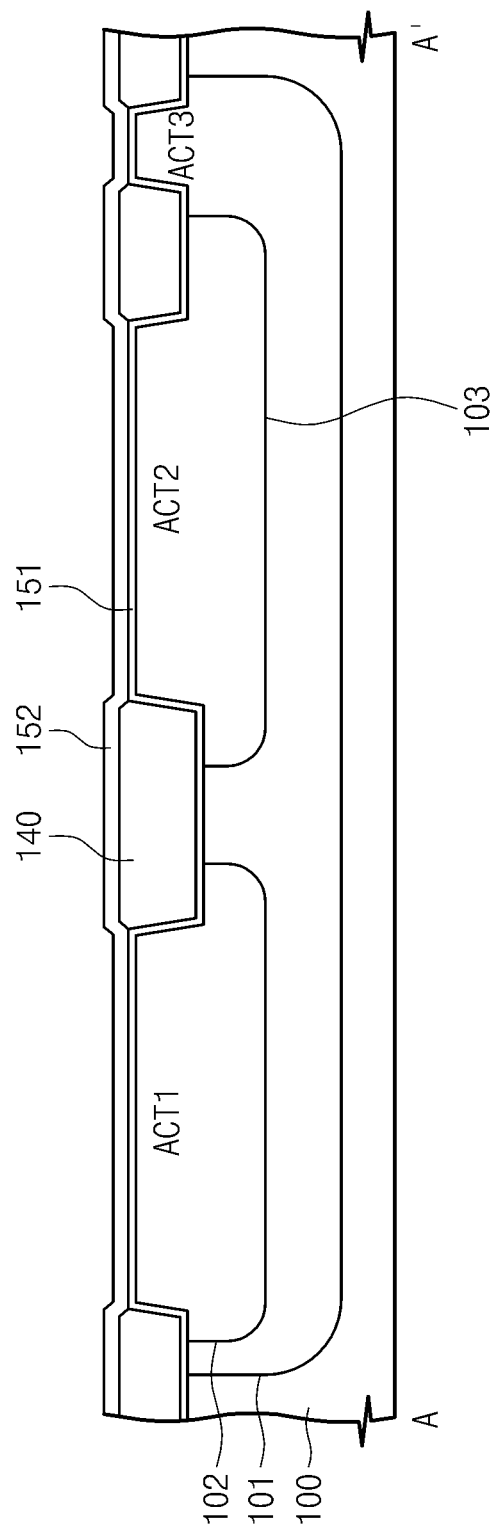
Figure 8:
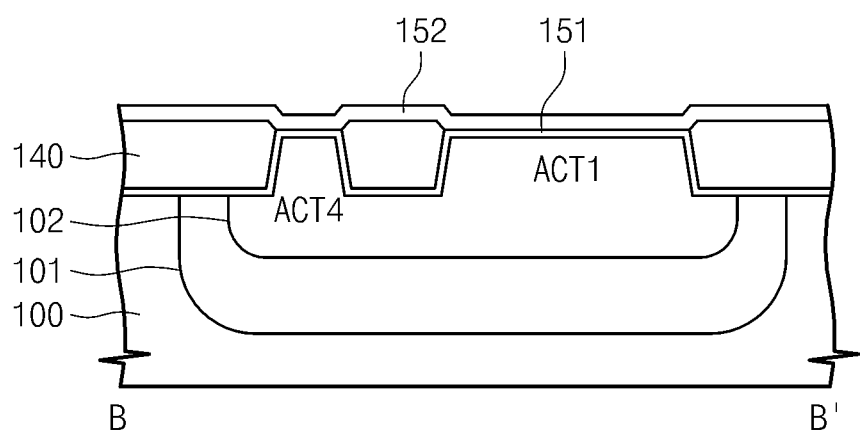

Referring to FIGS. 7 and 8, a first well 101 is formed in a substrate 100. The substrate 100 may be a silicon substrate, a germanium substrate, or a silicon-germanium substrate. The first well 101 is formed by doping part of the substrate with a second conductivity type impurity. As one example, the second conductivity type impurity is an n-type impurity and the substrate 100 is a structure doped with a p-type impurity (first conductivity type impurity).

A device isolation layer 140 defining first to fourth active regions ACT1 to ACT4 is formed on the substrate 100 having the first well 101. The device isolation layer 140 may be a silicon oxide layer and, in particular, a silicon oxide layer having an excellent gap-fill characteristic formed through a high density plasma chemical vapor deposition method. A liner insulation layer 151 is provided between the device isolation layer 140 and the substrate 100. The liner insulation layer 151 may be an oxide layer formed through a thermal oxidation process.

Second and third wells 102 and 103 are formed in the substrate 100. More specifically, parts of the substrate are doped with a first conductivity type impurity to form the second and third wells 102 and 103 are. The second and third wells 102 and 103 are formed in the first well 101 as spaced from each other. That is, the second and third wells 102 and 103 may be pocket wells. As an example, the second well 102 may be formed by doping the substrate 100 several times with a first conductivity type impurity at respectively different concentrations.

A first insulation layer 152 is formed on the substrate 100. The first insulation layer 152 may be a buffer insulation layer for a well process. Alternatively, the first insulation layer 152 may be an oxide layer used in a process of forming a logic device. As one example, transistors for various purposes such as low voltage (LV), medium voltage (MV), and high voltage (HV) are required during a DDI process and a thickness of each gate insulation layer may vary.

Figure 9:
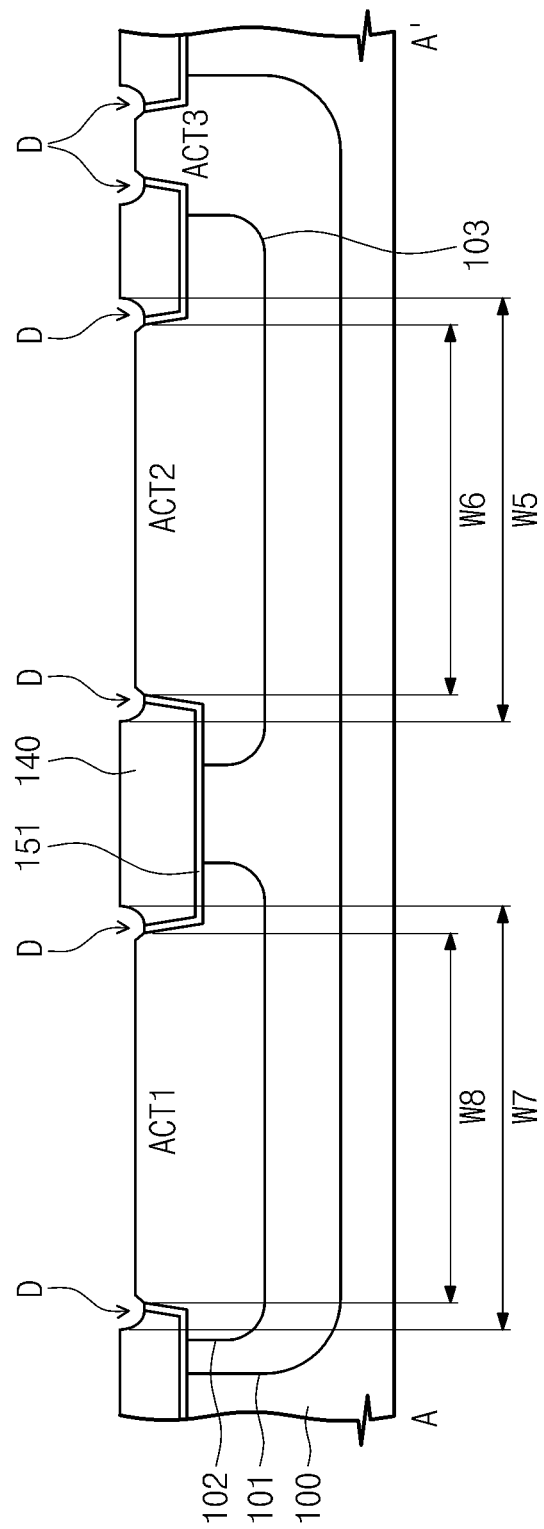
Figure 10:
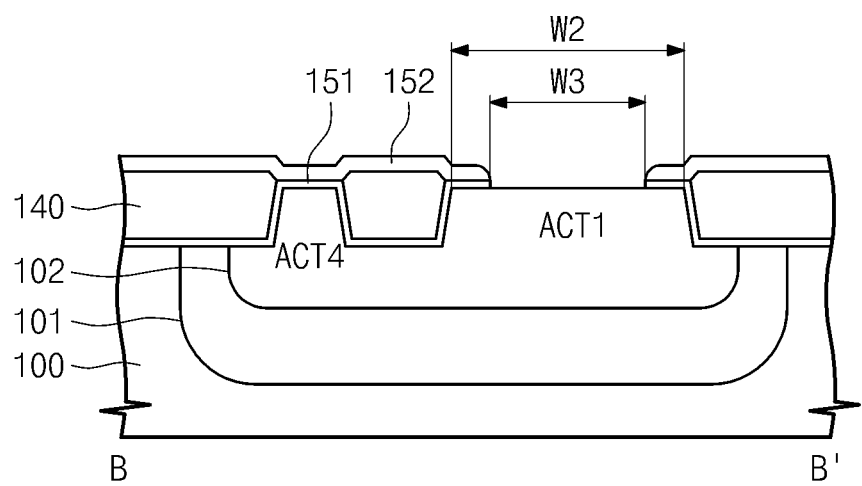

Referring to FIGS. 9 and 10, the liner insulation layer 151 and the first insulation layer 152 are patterned. The patterning process may be performed through wet etching. Upper edges of the device isolation layer 140 are removed by the patterning process. That is, indentations D are formed at upper parts of sidewalls of the device isolation layer 140. As a result, in the first active region ACT 1, the distance W7 between the upper edges of the device isolation layer 140 in the first active region ACT1 is greater than the width W8 of the top surface of the first active region ACT1. Likewise, in the second active region ACT2, the distance W5 between the exposed upper edges of the device isolation layers 140 is greater than the width W6 of the top surface of the second active region ACT2. Indentations D may also expose upper portions of sidewalls of the active regions ACT1 to ACT3. The crystallographic plane of the exposed upper portions of the sidewalls of the active regions ACT1 to ACT3 will be different than those of the top surfaces of the active regions ACT1 to ACT3. Additionally, stress may be concentrated at the upper portions of the sidewalls of the active regions ACT1 to ACT3 during the patterning process.

The patterning process leaves a portion of the first insulation layer 152 and/or the liner insulation layer 151 on the substrate over the first and fourth active regions ACT1 and ACT4 as shown in FIG. 10. In an example of this embodiment, the dimension W3 of the window left on the active region ACT1 by the patterning process (i.e., the removal of the first insulation layer 152 and/or the liner insulation layer 151) is less than the width W2 of the top surface of the first active region ACT1, in the widthwise direction of the channel.

Figure 11:
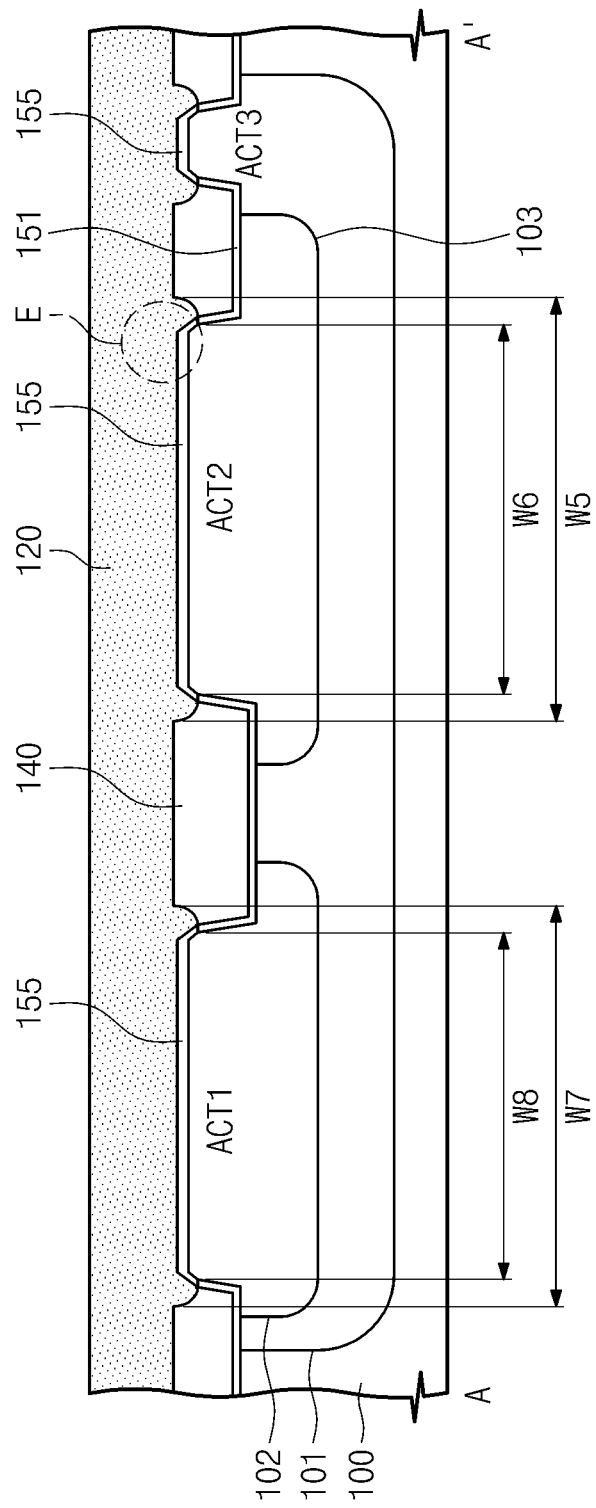
Figure 12:
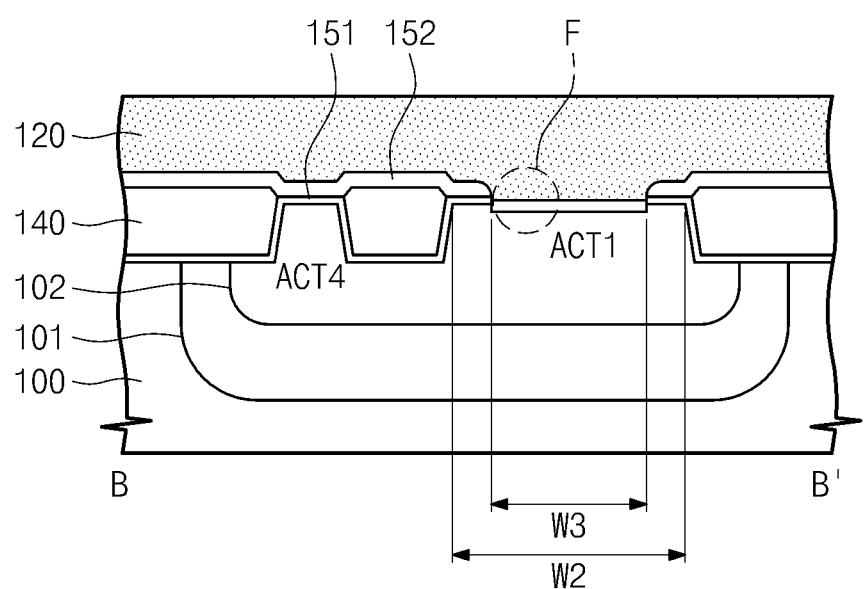

Referring to FIGS. 11 and 12, a second insulation layer 155 is formed on those portions of the active regions ACT1 to ACT3 exposed by the patterning process. The second insulation layer 155 may be formed by a thermal oxidation process. The dimension of the second insulation layer 155, in the widthwise direction of the channel, may be the same as W3. The bottom surface of the second insulation layer 155 may be located at a level lower than that of the top surface of the substrate 100. A conductive layer 120 is then formed on the substrate 100. The conductive layer 120 may comprise polysilicon.

Referring to FIGS. 2 through 4 again, the second insulation layer 155 and the conductive layer 120 are patterned. First and second tunneling insulation layers 156 and 157, a capacitor insulation layer 158, and first to third electrode patterns 121 to 123 are formed as a result of this patterning process. As shown in FIG. 4, the patterning process is performed such that the first electrode pattern 122 is narrower than the first active region ACT1, in the widthwise direction of the channel (i.e., W1<W2). As shown in FIG. 3, the patterning process forms the second electrode pattern 123 to be broader than the second active region ACT2, in the lengthwise direction of the channel (i.e., W9>W6).

In the example of this embodiment, spacers 163 are then formed on sidewalls of the electrode patterns 121 to 123. The spacers may be formed of an oxide, a nitride, or an oxide nitride. Also, a sidewall insulation layer 169 is formed on opposite sidewalls of the first electrode pattern 122 in the widthwise direction of the channel. The sidewall insulation layer 169 may be formed as sidewall spacers by a process known, per se, for forming such spacer patterns. Thus, the sidewall insulation layer 169 and the spacer 163 may be formed simultaneously. The sidewall insulation layer 169 overlaps the first active region ACT1 and the device isolation layer 140.

A first impurity region 111, a second impurity region 112, and a third impurity region 113 are then formed in the first active region ACT 1, in this example. The first impurity region 111 and the third impurity region 113 are formed below a sidewall of the third electrode pattern 121 and below a sidewall of the first electrode pattern 122, respectively. The second impurity region 112 is formed between the first and third electrode patterns 122 and 121. When the device is part of an array as shown in FIG. 1, the first impurity region 111 is connected to a bit line BL0, and the third impurity region 113 is connected to the common bit line selection lines BLS. The sidewall insulation layer 169 can prevent the second impurity region 112 from being electrically connected to the third impurity region 113 during the forming of the second impurity 112 and the third impurity region 113. The first to third impurity regions 111 to 113 are formed by doping respective portions of the first active region ACT 1 with an impurity of a different conductivity type than the second well 102.

A fourth impurity region 114 is formed in the fourth active region ACT4. The fourth impurity region 114, in this example as mentioned above, is used to apply an erase voltage $V_{ERS}$ to the second well 102. The fourth impurity region 114 is formed by doping a portion of the fourth active region ACT4 with an impurity of the same conductivity type as the second well 102. In this respect, the fourth impurity region 114 may have a higher concentration of dopant than the second well 102.

A fifth impurity region 115 and a sixth impurity region 116 are formed in the second active region ACT2 below sidewalls of the second electrode pattern 123, respectively. The fifth and sixth impurity regions 115 and 116 are used to apply a control gate voltage VCG to the second active region ACT2. The fifth and sixth impurity regions 115 and 116 are formed by doping respective portions of the second active region ACT2 with impurities of different conductivity types. In another example of this method, only one of the fifth and sixth impurity regions 115 and 116 is formed.

A seventh impurity region 117 is formed in the third active region ACT3. The seventh impurity region 117 is used to apply a voltage to the first well 101. The seventh impurity region 117 is formed by doping part of the third active region ACT3 with an impurity of the same conductivity type as the first well 101. In this respect, the seventh impurity region 117 may be doped at a higher concentration than the first well 101. A silicide layer (not shown) for enhancing ohmic contact may be formed by a silicidizing process on each of the first to seventh impurity regions 111 to 117. For example, a cobalt silicide layer may be formed on each of the first to seventh impurity regions 111 to 117.

Then an interlayer insulation layer 161 is formed on the substrate 100. First and second vias 131 and 132 connected to the first and second electrode patterns 122 and 123, respectively, are formed in the interlayer insulation layer 161. Then a conductive line 133 contacting the first and second vias 131 and 132 and hence, electrically connecting the first electrode pattern 122 with the second electrode pattern 123, is formed on the interlayer insulation layer 161. The first and second vias 131 and 132 and the conductive line 133 may be formed of at least one of metal, metal silicide, conductive metal nitride, and a doped semiconductor material.

Figure 13:
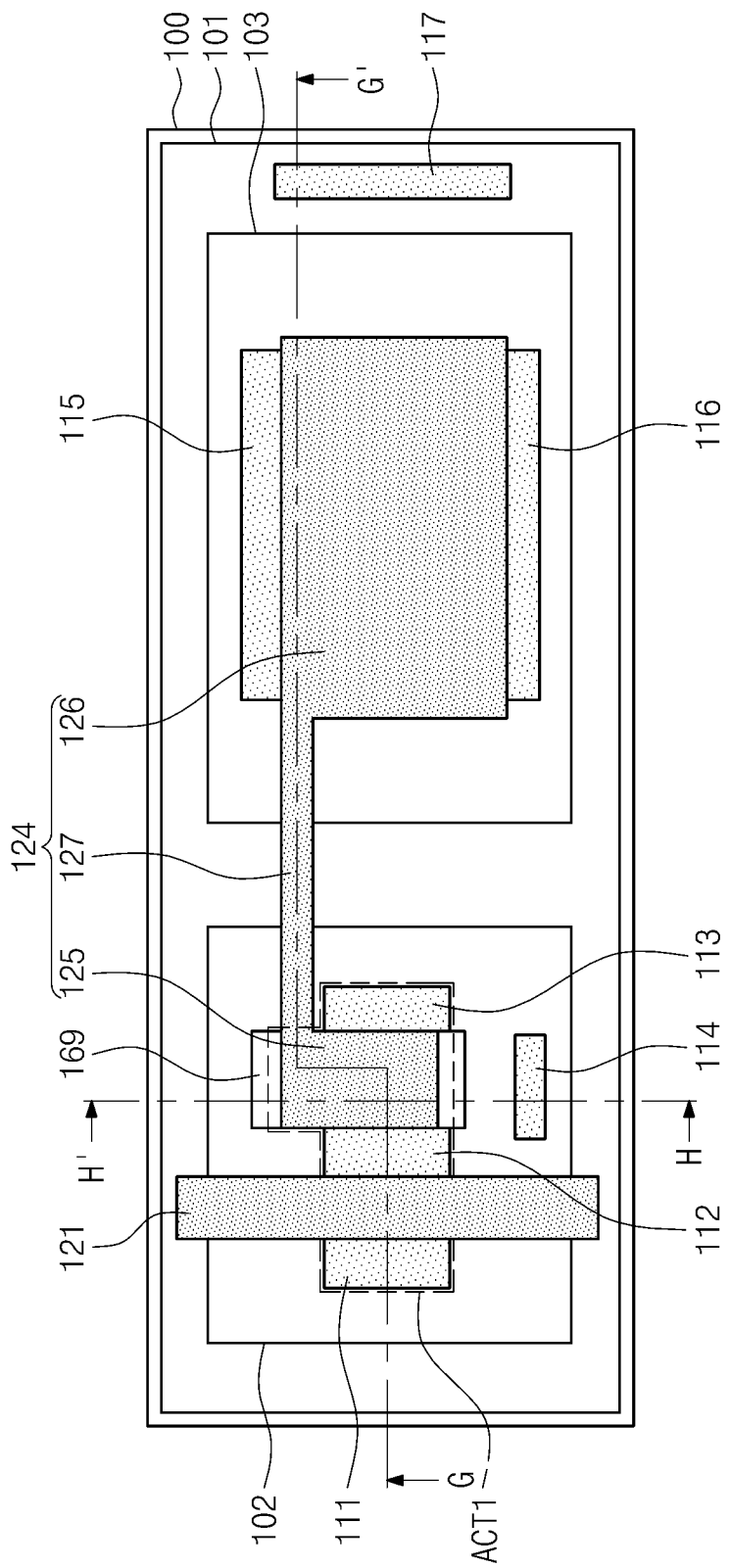
FIG. 13 is a plan view of a second embodiment of the memory device according to the inventive concept.

A second embodiment of a memory device according to the inventive concept will now be described with reference to FIGS. 13 through 15. For the sake of brevity, technical features which are similar to those of the first embodiment will not be described in particular detail. Also, aspects of the method of fabricating the second embodiment of the device will be clear from the method described above.

In this embodiment, a common electrode 124 is disposed on the substrate 100. The common electrode 124 includes a first electrode pattern 125 on the first active region ACT1 and a second electrode pattern 126 on the second active region ACT2. The common electrode 124 may also include an electrode connection pattern 127 extending between the first electrode pattern 125 and the second electrode pattern 126.

The first electrode pattern 125 and the tunnel insulation layer 157 on the first active region ACT1 constitute a MOSFET, in this embodiment. The second electrode pattern 126 and a capacitor insulation layer 158 on the second active region ACT2 constitute a MOS capacitor.

Figure 14:
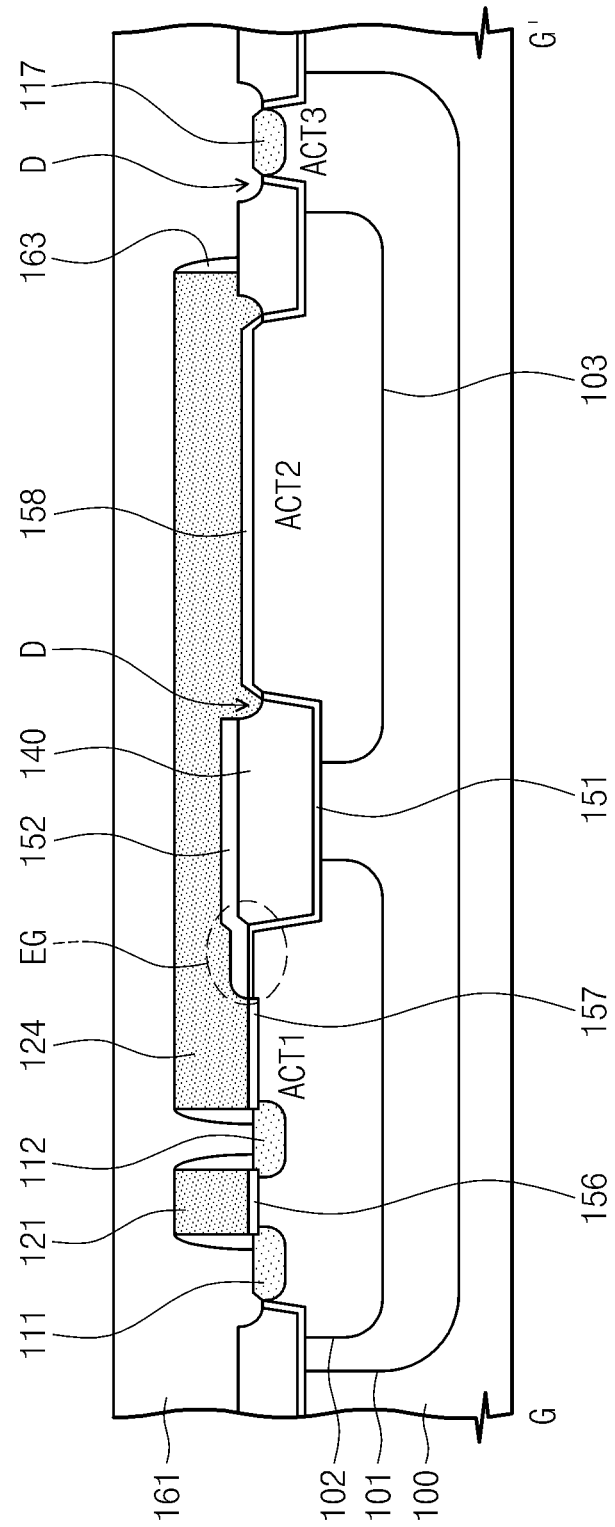
FIG. 14 is a sectional view taken along line G-G' of FIG. 13.

As shown best in FIG. 14, a first insulation layer 152 and/or a liner insulation layer 151 is provided at a peripheral portion EG of the first active region ACT1 in the lengthwise direction of the channel. The first insulation layer 152 and/or the liner insulation layer 151 prevent edge thinning in a region where the first active region ACT1 and the common electrode 124 overlap.

A capacitor insulation layer 158 is provided between the common electrode 124 and the second active region ACT2. The tunnel insulation layer 157 and the capacitor insulation layer 158 may be a thermal oxide layer. Bottom surfaces of the tunnel insulation layer 157 and the capacitor insulation layer may be disposed at a level lower than that of the top surface of the substrate 100.

The memory device according to the second embodiment of the inventive concept has a single gate structure. Accordingly, the memory device may be easily and simultaneously manufactured with logic devices.

Figure 15:
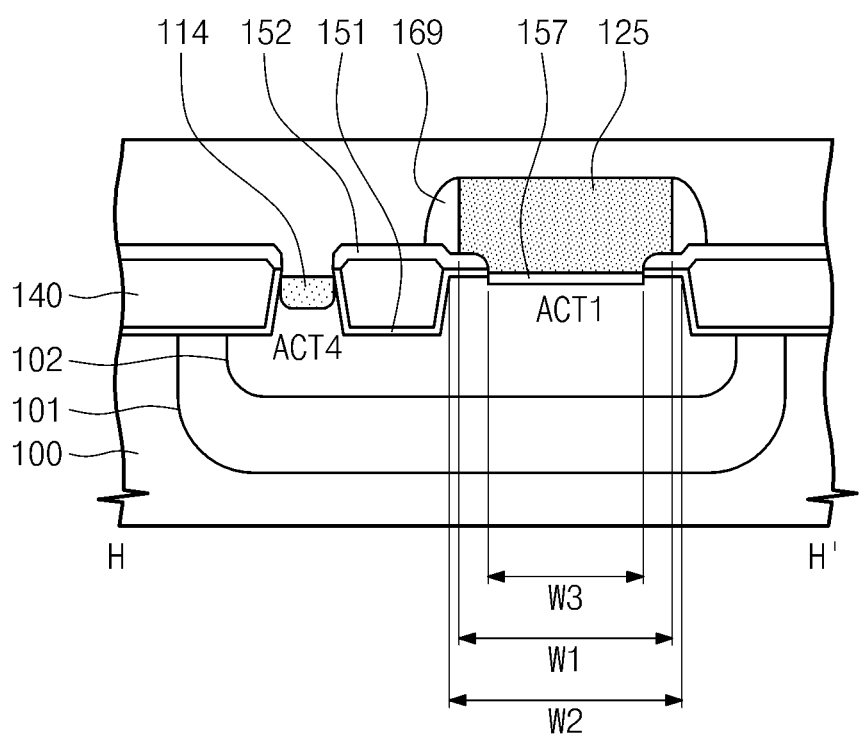
FIG. 15 is a sectional view taken along line H-H' of FIG. 13.
Figure 16:
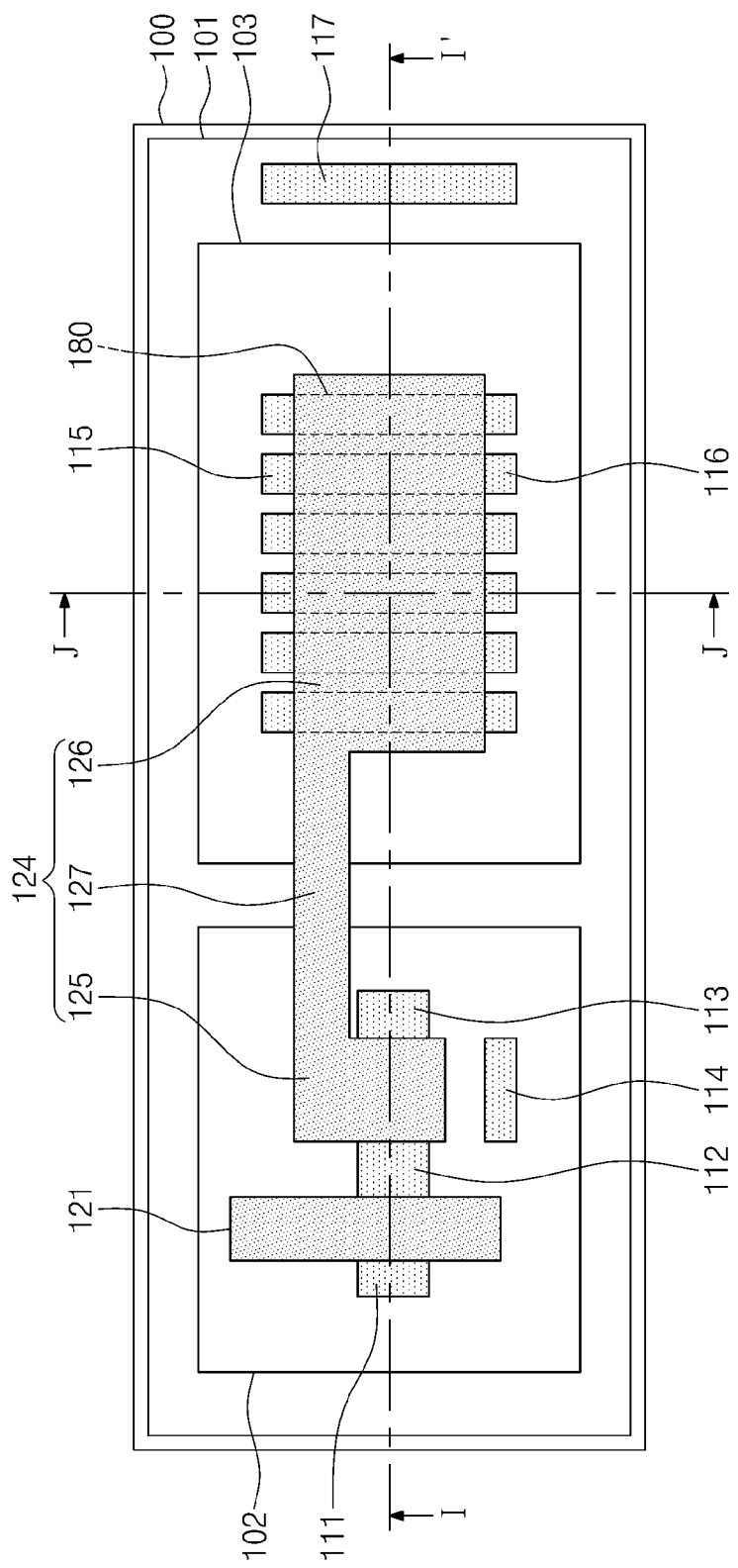
FIG. 16 is a plan view of a third embodiment of the memory device according to the inventive concept.
Figure 17:
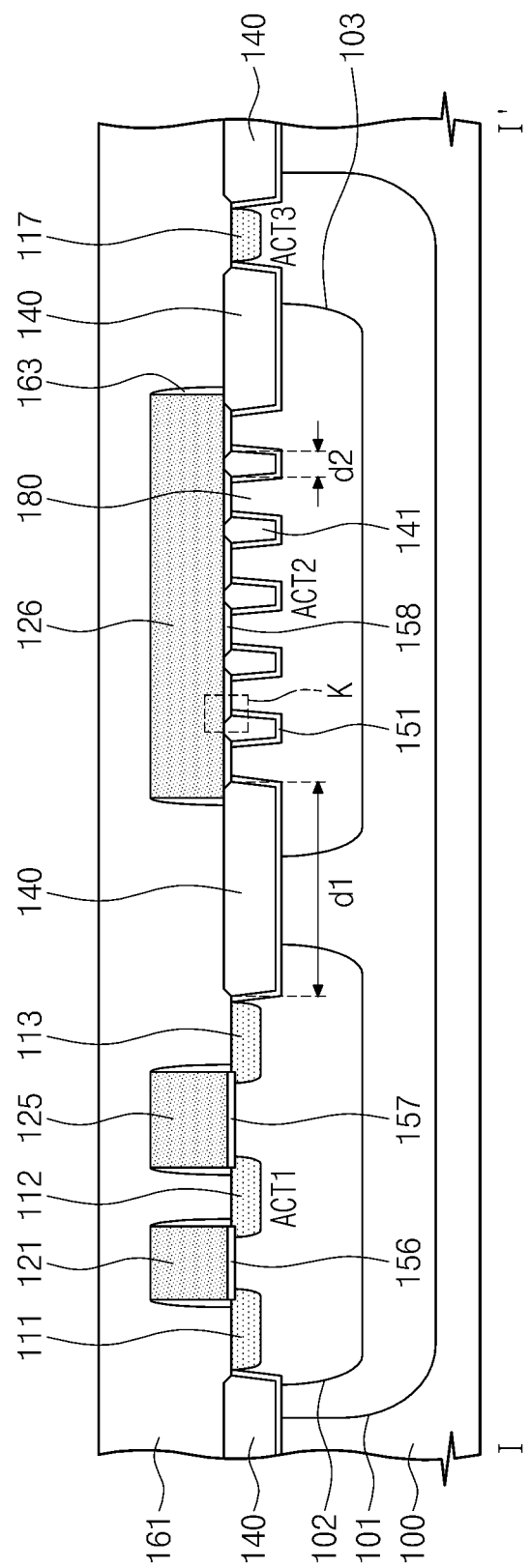
FIG. 17 is a sectional view taken along line I-I' of FIG. 16.
Figure 18:
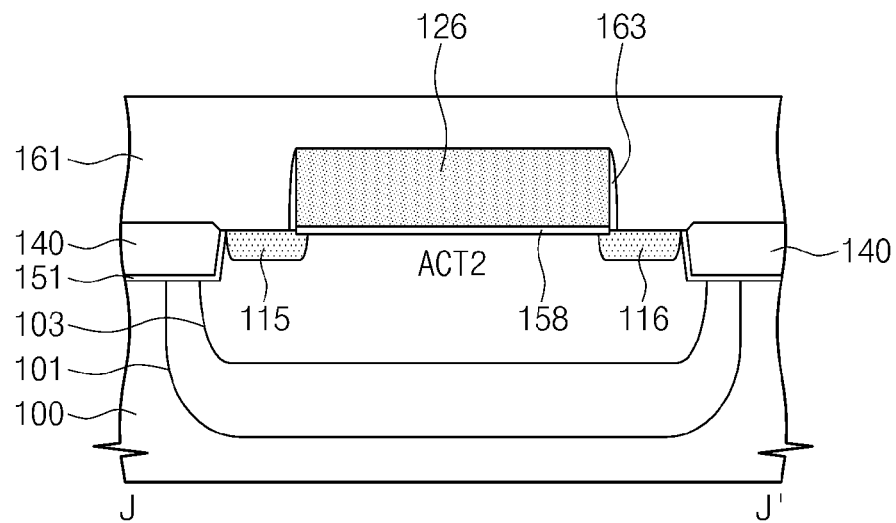
FIG. 18 is a sectional view taken along line J-J' of FIG. 16.

FIGS. 14 and 15 also illustrate the provision of the indentation(s) D in the upper edge(s) of the device isolation layer adjacent second active region ACT2. The first insulation layer 152 and/or a liner insulation layer 151 at the peripheral portion EG of the first active region ACT1 extends over the upper edge of the device isolation layer 140 adjacent second active region ACT2. Thus, according to the second embodiment of the inventive concept as well, selective provision of edge thinning resolves the problem of threshold voltage scatter while offering a higher capacitance for a capacitor of the memory device.

A third embodiment a memory device according to the inventive concept will now be described with reference to FIGS. 16 through 19. For the sake of brevity, technical features which are similar to those of the first embodiment will not be described in particular detail.

A MOSFET including a first electrode pattern 125 and a tunnel insulation layer 157 are provided on the first active region ACT1. A MOS capacitor including a second electrode pattern 126 and a capacitor insulation layer 158 are provided on the second active region ACT2. An electrode connection pattern 127 extends from the first electrode pattern 125 to the second electrode pattern 126. The first and second electrode patterns 125 and 126 may be formed of the same material as (unitarily with) the electrode connection pattern 127. The first and second electrode patterns 125 and 126 connected by the electrode connection pattern 127 form a common electrode 124, similarly to the second embodiment described above. Thus, in the example of this embodiment as well, the memory device has a single gate structure in which the common electrode 124 constitutes a floating gate of the memory device and the third well 103 constitutes a control gate of the memory device. Hence, the memory device of this embodiment may be easily and simultaneously manufactured with logic devices.

In this embodiment, a second device isolation layer 141 is provided below the second electrode pattern 126. The second device isolation layer 141 may have the same thickness as the first device isolation layer 140. The second device isolation layer 141 may also have a plurality of segments (discrete or connected). In any case, the second device isolation layer 141 divides the second active region ACT2 into a plurality of active sections 180. The active sections 180 are separated from one another below the second electrode pattern 126 by the second device isolation layer 141. More specifically, in this example of the third embodiment, the second device isolation layer 141 has segments in the form of strips across which the second electrode pattern 126 extends, and the second electrode pattern 126 covers at least a portion of each of the resulting active sections 180 defined between adjacent ones of the strips. Furthermore, in the direction in which the MOSFET is connected to the MOS capacitor, the width d2 of each strip-shaped segment of the second device isolation layer 141 is less than that d1 of the first device isolation layer 140.

Figure 19:
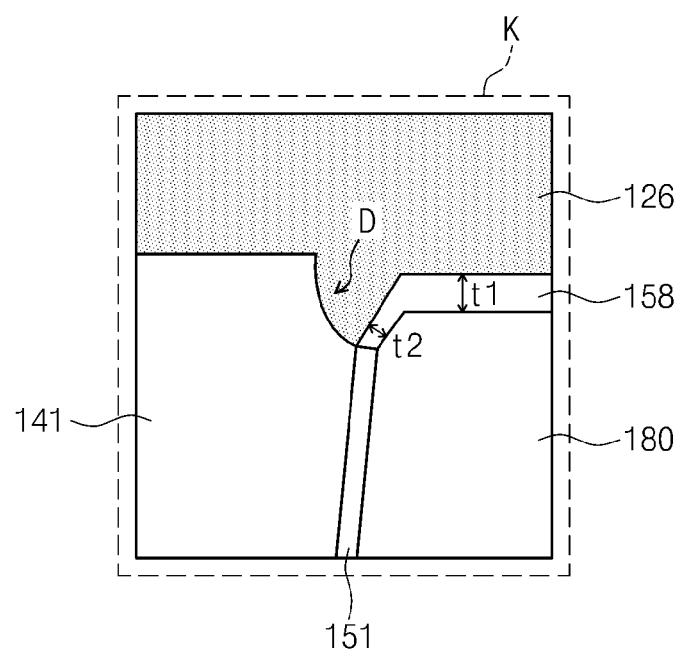
FIG. 19 is an enlarged view of portion K of the memory device in FIG. 17.

As represented in FIG. 19, indentations D are provided in those of the upper edges of the second device isolation layer 141 which are spaced from one another in the lengthwise direction of the channel (i.e., in the direction of line I-I' since the channel refers to that below the tunnel insulation layer 157). The indentations D are thus elongated in the widthwise direction of the channel (in the direction of line J-J'). In another example, the indentations D surround the active sections 180, respectively. Indentations D may also be provided in the upper edges of the first device isolation layer 140 located beneath the second electrode pattern 126. In any case, the indentations D are created because portions of sidewalls of the second device isolation layer 141 are removed by the process used to form first insulation layer 152 (refer back to FIG. 14).

Respective ones of the indentions D expose upper portions of the sidewalls of the active sections 180. For the reasons explained earlier with respect to the crystallography of the device isolation layer, the thickness t2 of that part of the capacitor insulation layer 158 extending along the upper portion of the sidewall of an active section 180 (exposed by an indentation D) is less than the thickness t2 of that part of the capacitor insulation layer 158 extending along the top surface of the active section 180.

Also, as explained above in connection with the previous embodiments, the capacitor insulation layer 158 serves as a dielectric of a MOS capacitor, and the reduction in thickness of the insulation layer 158 due to the edge thinning results in a corresponding increase in the capacitance of the MOS capacitor. Accordingly, only a relatively small control gate voltage VCG needs to be applied to the memory cell. Also, the area of the second electrode pattern 123 may be minimized. Thus, the inventive concept facilitates the scaling down of chips having both memory and logic devices, for example.

A method of forming a third embodiment of the memory device according to the inventive concept will now be described with reference to FIGS. 20 through 29. Those steps and processes which are similar to those described above, e.g., in connection with the method shown in FIGS. 7-12, will not be described in particular detail for the sake of brevity.

Figure 20:
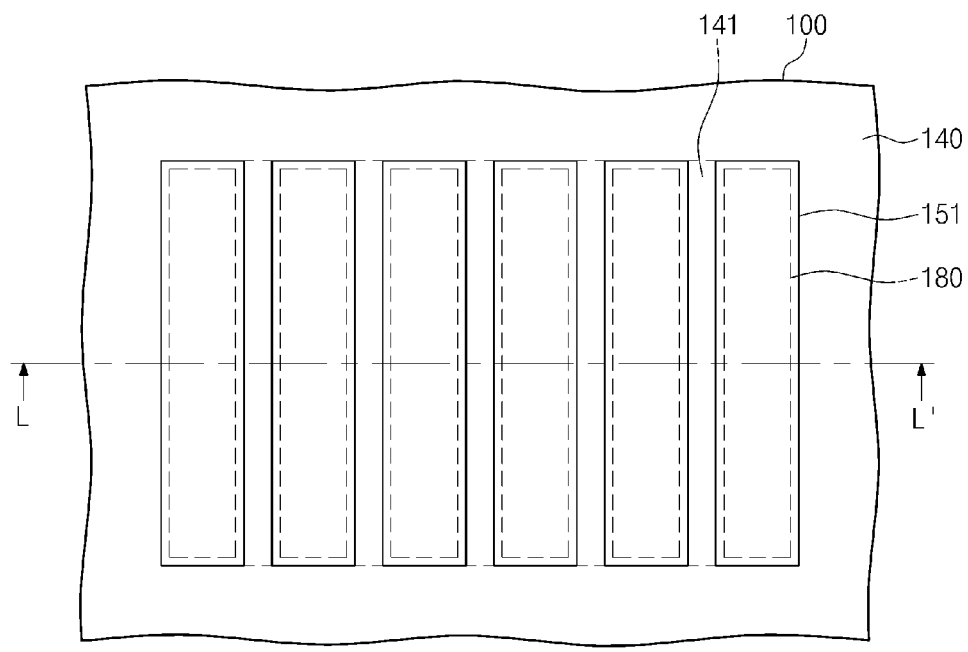
Figure 21:
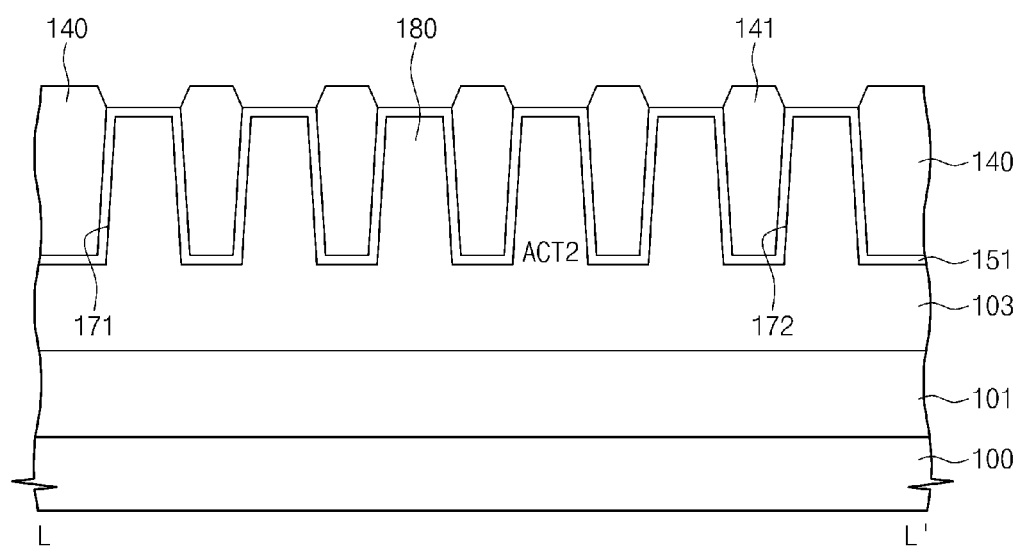

Referring to FIGS. 20 and 21, a first well 101 is formed in a substrate 100. The substrate 100 may be a silicon substrate, a germanium substrate, or a silicon-germanium substrate. The first well 101 is formed by doping part of the substrate with a second conductivity type impurity. As one example, the second conductivity type impurity is an n-type impurity and the substrate 100 is a structure doped with a p-type impurity (first conductivity type impurity). A third well 103 is formed in the first well 101. That is, the third well 103 may be a pocket well. The third well 103 is formed by doping a portion of the substrate 100 with an impurity of the first conductivity type. More specifically, the third well 103 may be formed by doping a portion of the substrate 100 several times with an impurity at respectively different concentrations.

A first device isolation layer 140 for defining the second active region ACT2 is formed in the substrate 100. The first device isolation layer 140 is formed by forming a first trench 171 in the substrate 100 and filling the trench 171 with insulating material. A second device isolation layer 141 for separating the second active region ACT2 into a plurality of active sections 180 is formed by forming second trenches 172 in the substrate and filling the second trenches 172 with insulation material. The first and second trenches 171 and 172 may be formed to the same depth. In this case, the first and second device isolation layers 140 and 141 have the same thickness. A liner insulation layer 151 may be formed on the substrate 100, including in the trenches 171 and 172, before the trenches 171 and 172 are filled. In particular, the liner insulation layer 151 may be an oxide layer formed through a thermal oxidation process.

The first and second device isolation layers 140 and 141 may be formed simultaneously. That is, the first and second trenches 171 and 172 may be formed simultaneously and the first and second trenches 171 and 172 may be filled with insulation material simultaneously. As was already described, the first and second device isolation layers 140 and 141 may be formed of a silicon oxide, especially, a silicon oxide formed through a high density plasma chemical vapor deposition method so as to have excellent gap-filling characteristics.

Figure 22:
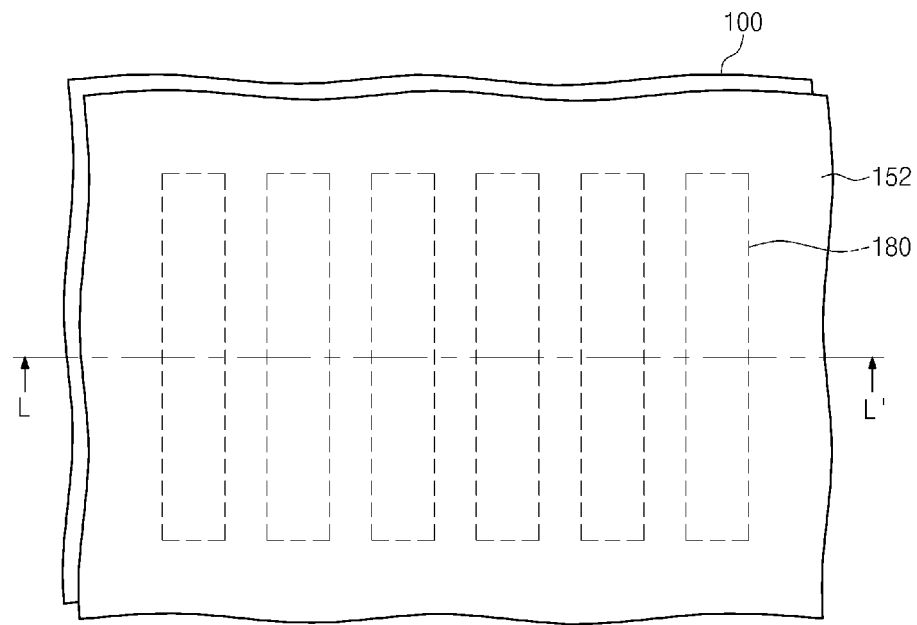
Figure 23:
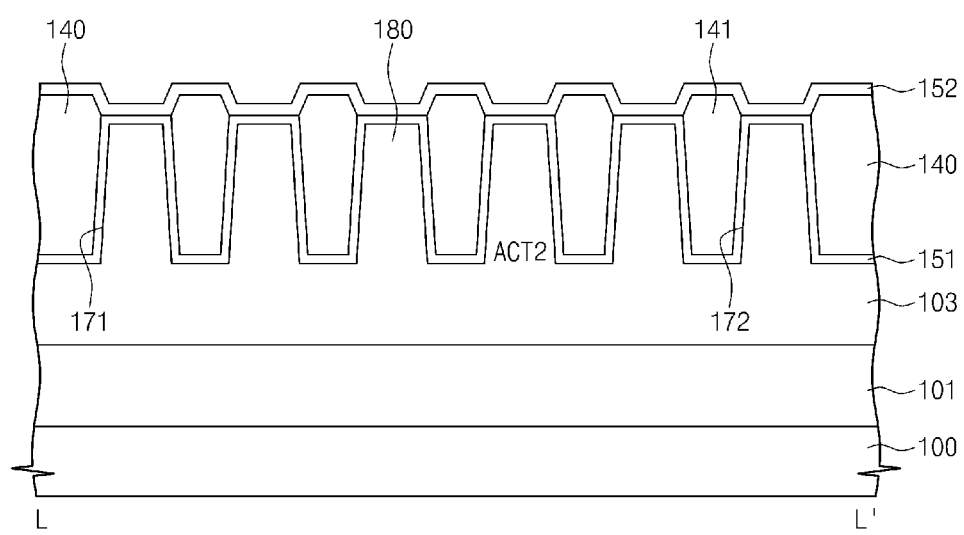

Referring to FIGS. 22 and 23, a first insulation layer 152 is formed on the substrate 100. The first insulation layer 152 may be used as a buffer insulation layer or an oxide layer of a logic device. As one example, transistors for various purposes such as low voltage (LV), medium voltage (MV), and high voltage (HV) are required during a DDI process and a thickness of each gate insulation layer may vary.

Figure 24:
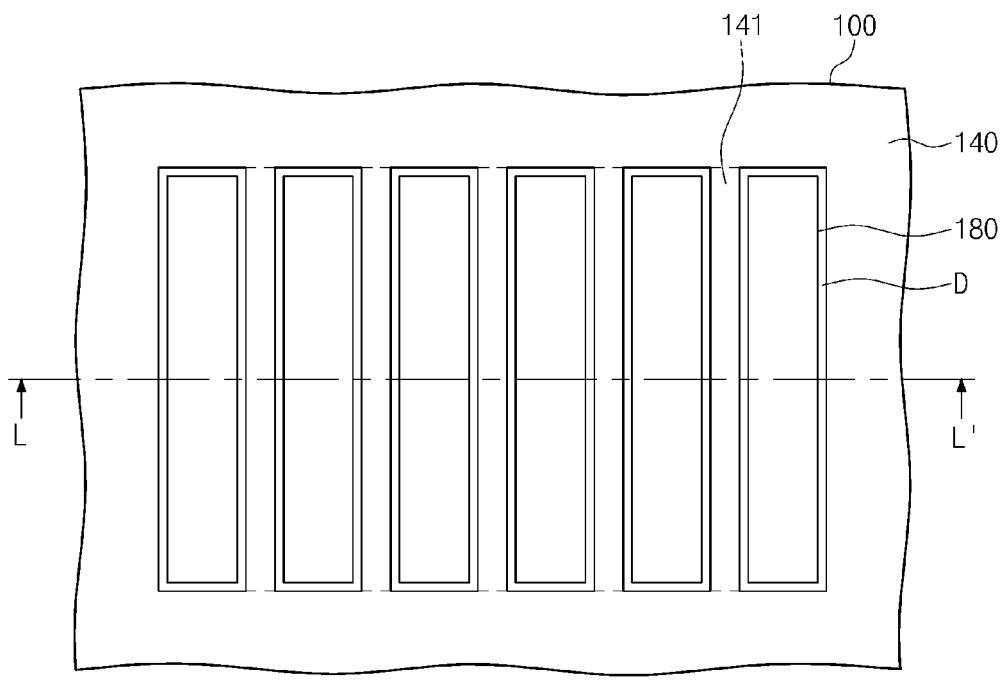
Figure 25:
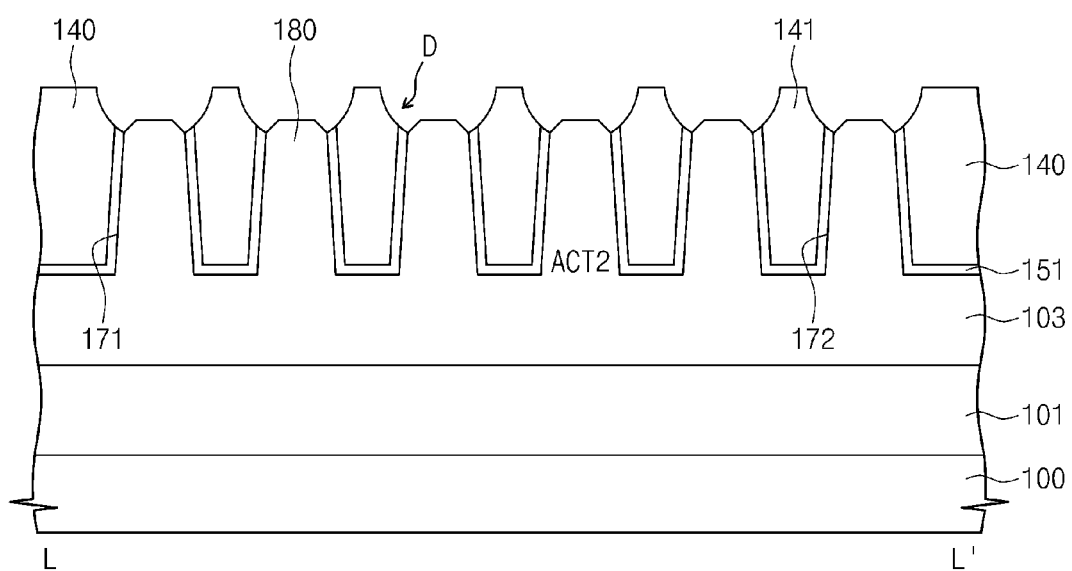

Referring to FIGS. 24 and 25, a portion of the liner insulation layer 151 and the first insulation layer 152 is removed to expose the tops of the active sections 180. This removal process may be a wet etching process. During the etching process, upper edges of the first and second device isolation layers 140 and 141 are removed such that indentations D are formed. In another example of this method, a portion of the first insulation layer 152 is left atop the first and second device isolation layers 140 and 141.

Figure 26:
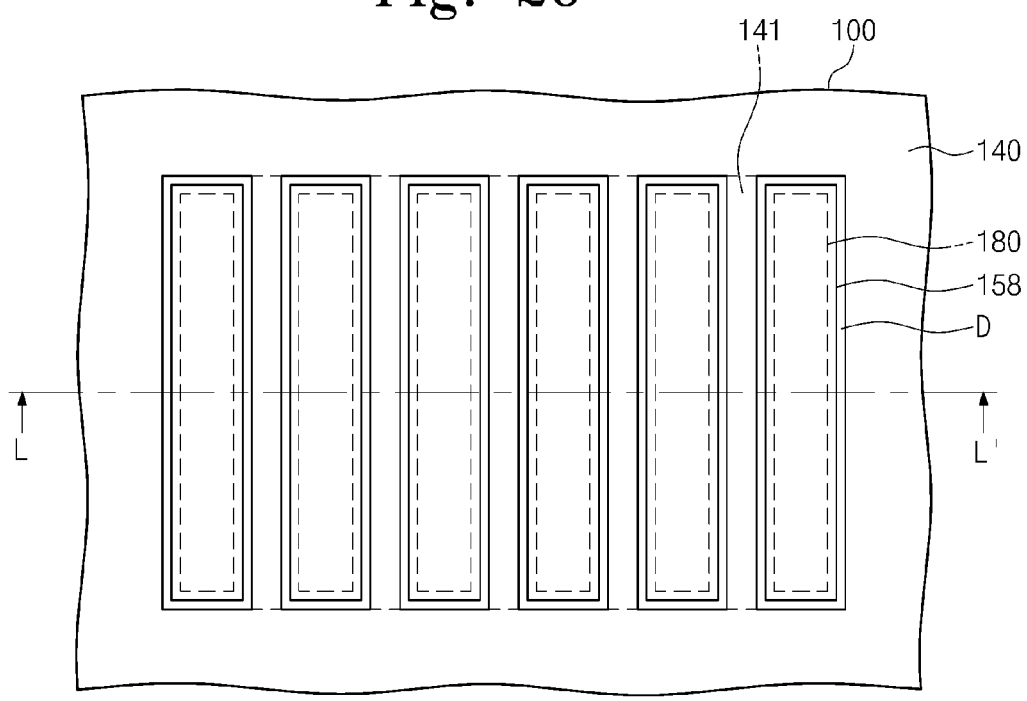
Figure 27:
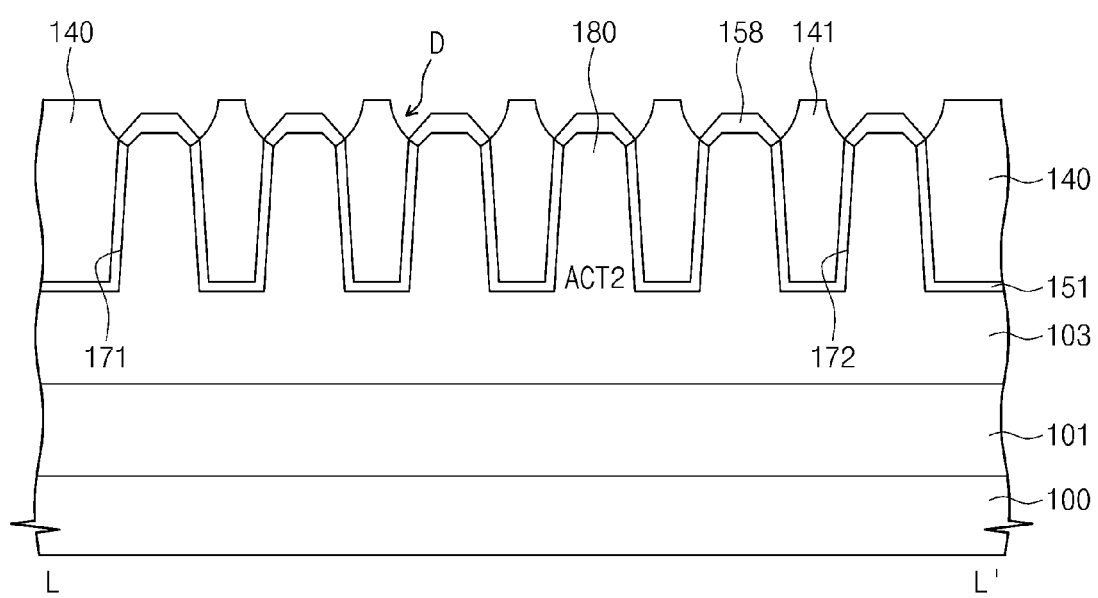

Referring to FIGS. 26 and 27, a capacitor insulation layer 158 is formed on the active sections 180 by a thermal oxidation process. The capacitor insulation layer 158 is formed to such a thickness that the top surface of the capacitor insulation layer 158 is disposed at a level lower than that of the second device isolation layer 141. Also, a portion of the capacitor insulation layer 158 may overlap the liner insulation layer 151 or the second device isolation layer 141. For the reasons described above, edge thinning occurs along the periphery of each portion of the capacitor insulation layer 158 disposed atop a strip-shaped active section 180 of the second active region ACT2.

Figure 28:
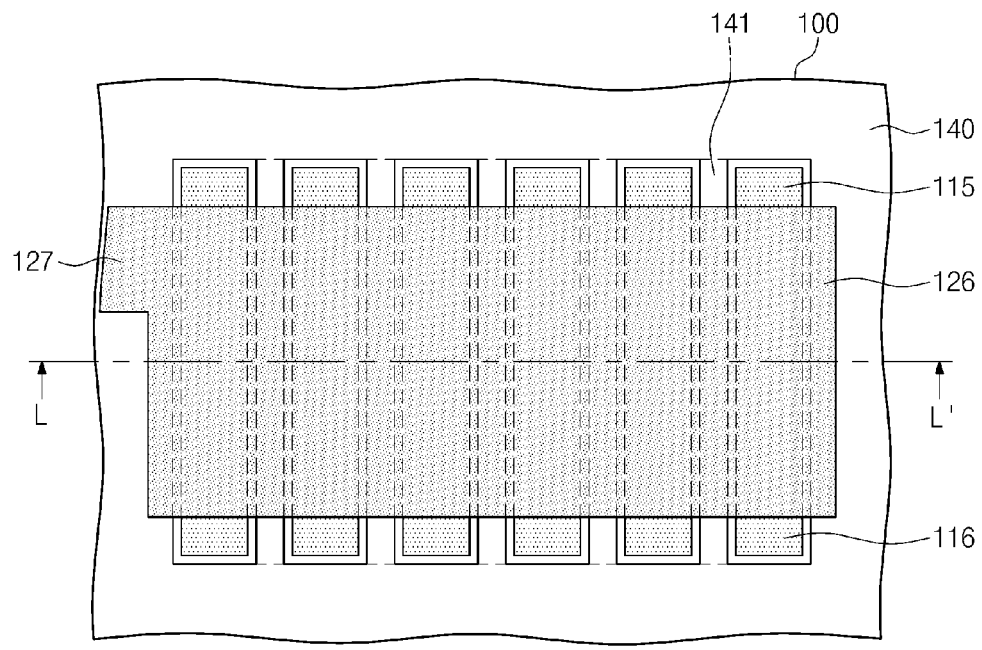
Figure 29:
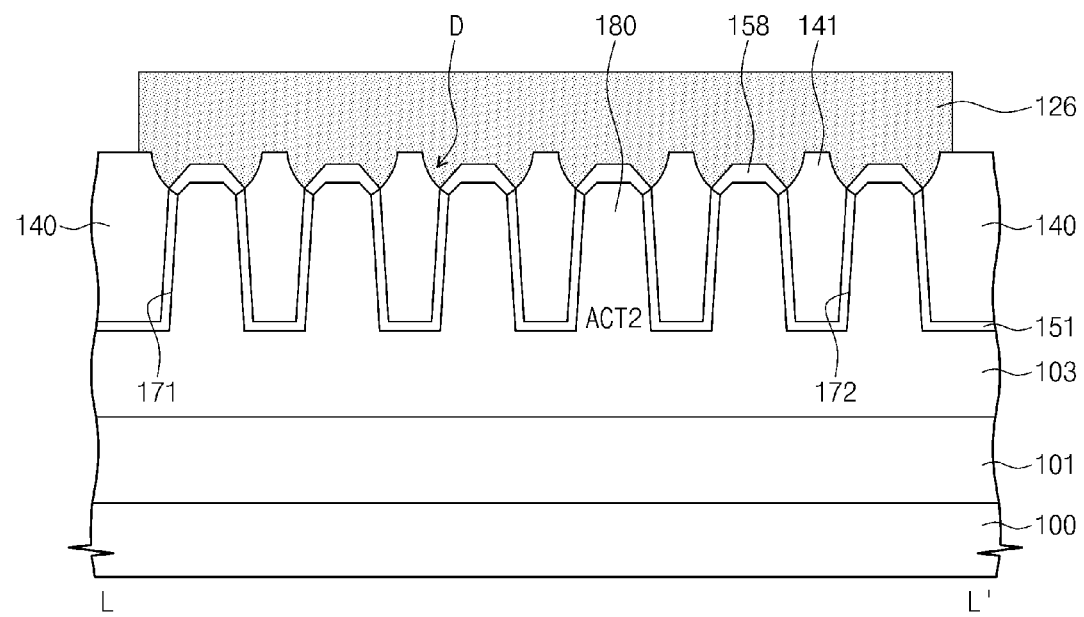

Referring to FIGS. 28 and 29, a conductive layer (not shown) is formed on the capacitor insulation layer 158, and the conductive layer is patterned to form second electrode pattern 126 on the capacitor insulation layer 158. Electrode connection pattern 127 for connecting the second electrode pattern 126 with the first electrode pattern 125 may be formed by this patterning process, as well.

Furthermore, in this example, the second electrode pattern 126 exposes a portion of the capacitor insulation layer 158 at opposite sides of the second electrode pattern 126 in the widthwise direction of the channel. The capacitor insulation layer 158 exposed by the second electrode pattern 126 is removed. Then a fifth impurity region 115 and a sixth impurity region 116 are formed at first and second ends of the active sections 180, respectively, from where the capacitor insulation layer 158 was removed. The fifth and sixth impurity regions 115 and 116 may extend below sidewalls of the second electrode pattern 126. The fifth and sixth impurity regions 115 and 116 are formed by doping the first and second ends of the active sections 180 with impurities of different conductivity types, respectively. In another example of this embodiment, only one of the fifth and sixth impurity regions 115 and 116 is formed. Then, a silicide layer (not shown), e.g., a cobalt silicide layer, may be formed on the first to seventh impurity regions 111 to 117.

Figure 30:
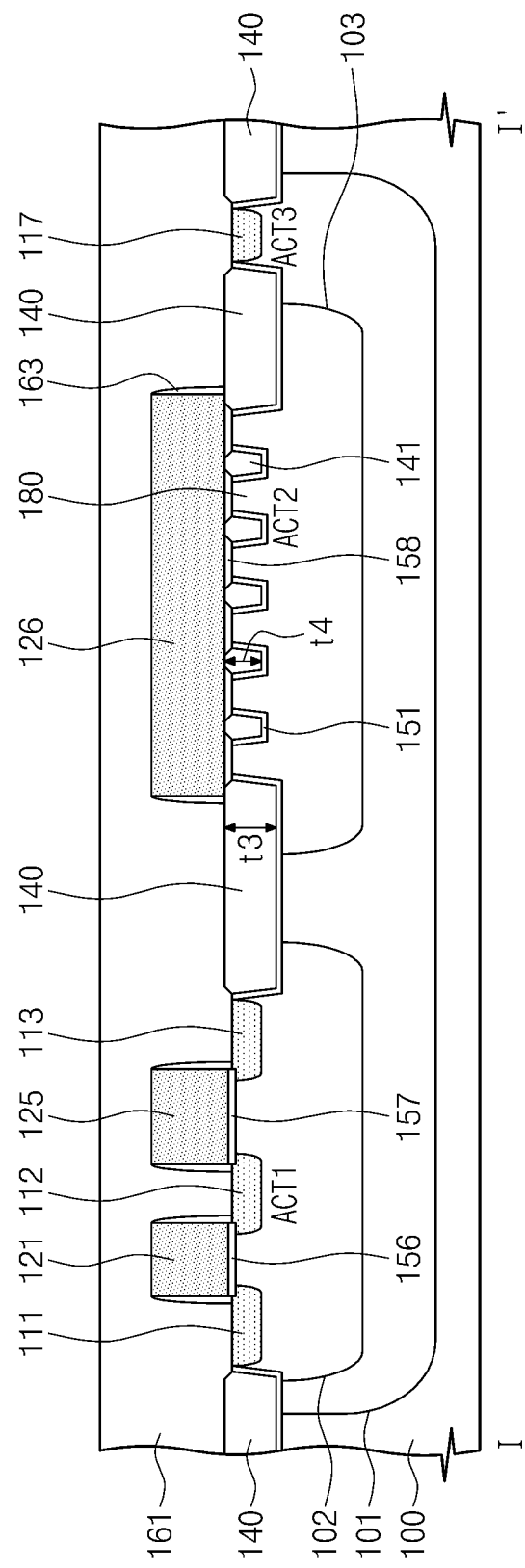
FIGS. 30 and 31 are sectional views illustrating another version of the third embodiment of a method of forming a semiconductor memory device, according to the inventive concept.
Figure 31:
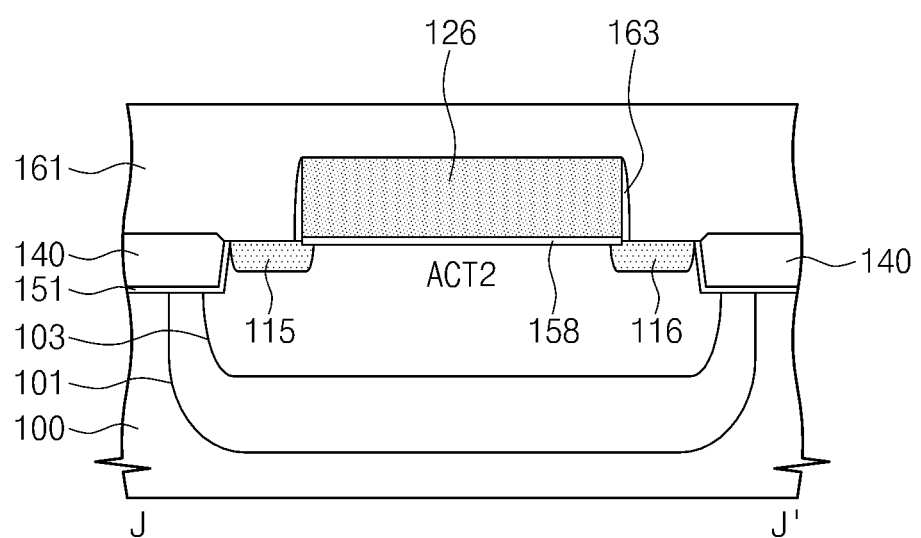

Another version of the third embodiment of a memory device according to the inventive concept is shown in FIGS. 30 and 31.

In this version, the thickness t4 of the second device isolation layer 141 is greater than the thickness t3 of the first device isolation layer 140. The distance from the top surface of the substrate 100 to the bottom surface of the second device isolation layer 141 is also less than the distance from the top surface of the substrate 100 to the bottom surface of the first device isolation layer 140. The first and second device isolation layers 140 and 141 may be formed by forming a plurality of trenches of different depths, and then simultaneously filling the trenches. Alternatively, the first device isolation layer 140 may be formed, and then second trenches are formed and filled to form the second device isolation layer 141. The thickness of the second device isolation layer 141 may be selected to maximize the capacitance.

Figure 32:
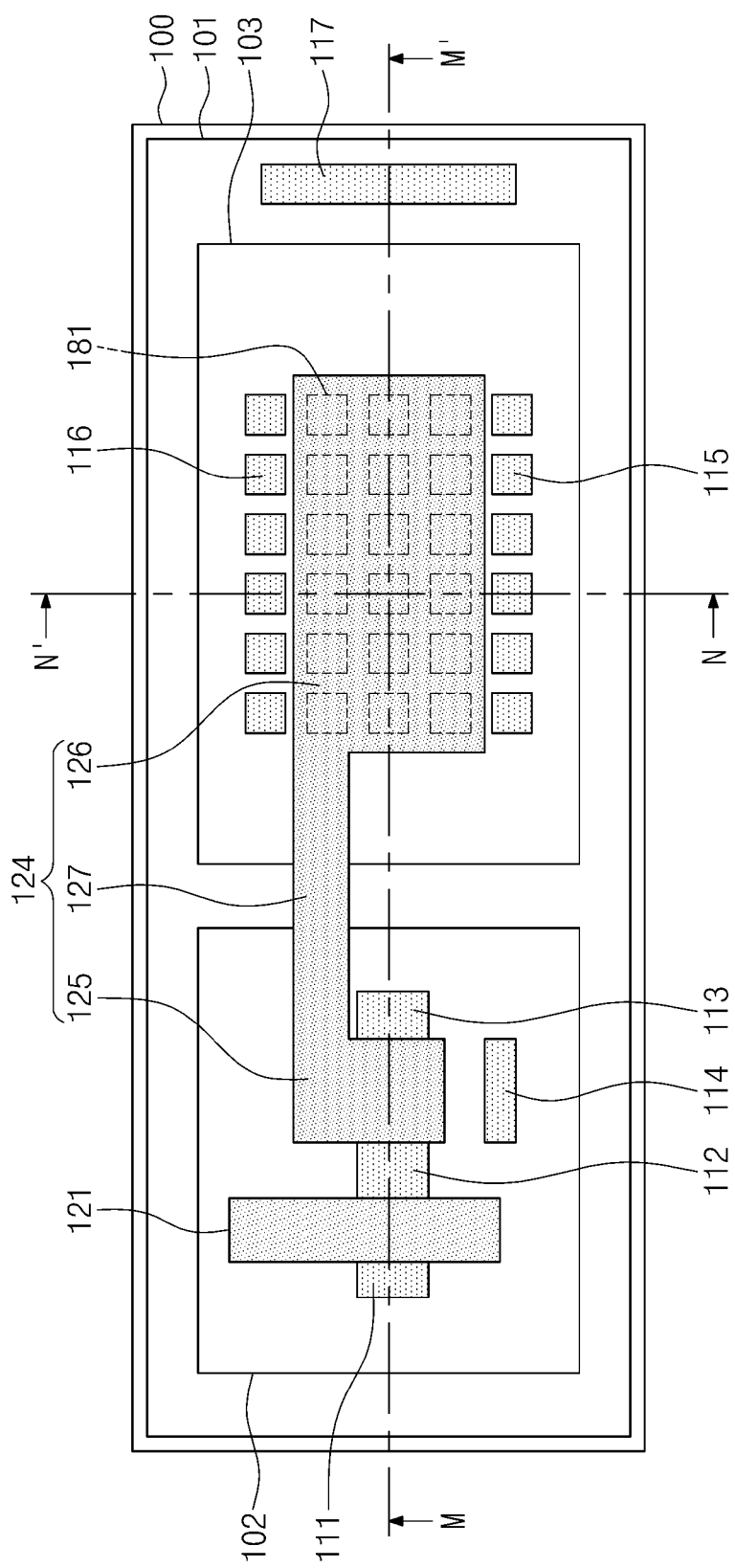
FIG. 32 is a plan view of a fourth embodiment of a memory device according to the inventive concept.
Figure 33:
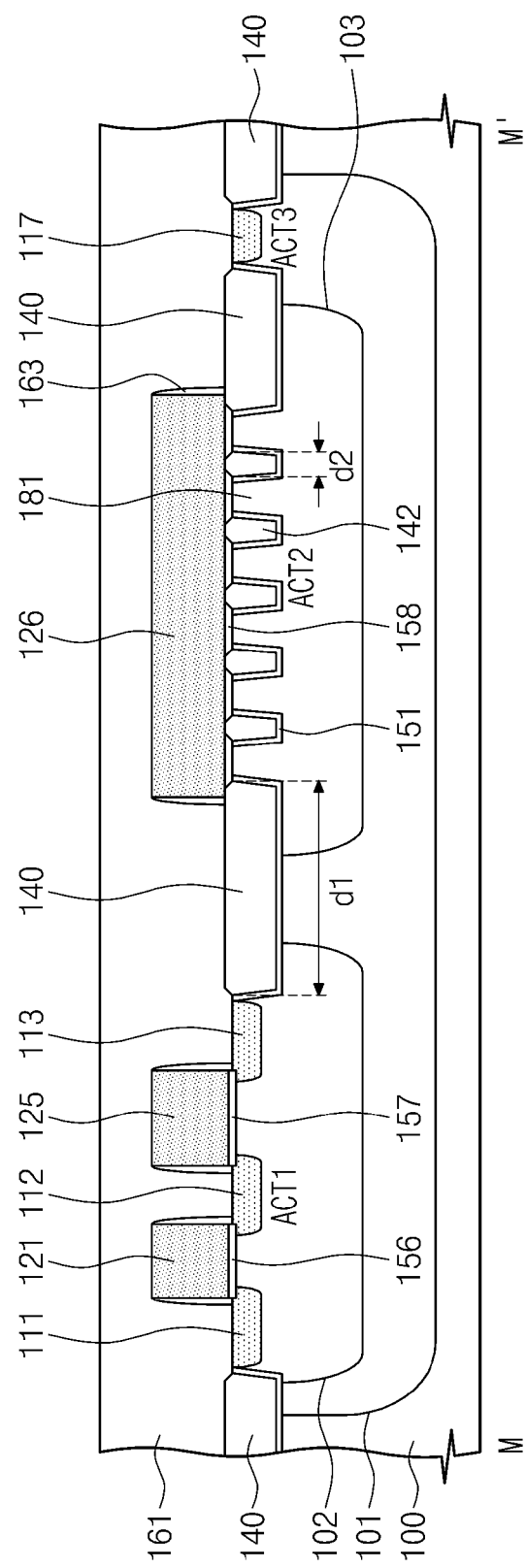
FIG. 33 is a sectional view taken along line M-M' of FIG. 32.
Figure 34:
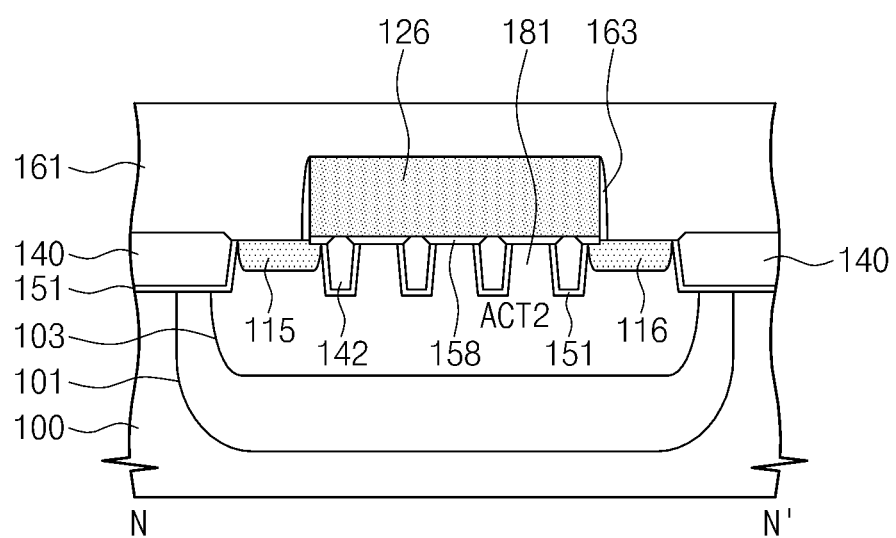
FIG. 34 is a sectional view taken along line N-N' of FIG. 32.

A fourth embodiment of a memory device according to the inventive concept will now be described with reference to FIGS. 32 through 34. For the sake of brevity, technical features which are similar to those of the above-described embodiments will not be described in particular detail.

In this embodiment, a second device isolation layer 142 is provided below the second electrode pattern 126. The second device isolation layer 142 may be connected to and may be unitary with the first device isolation layer 140. The second device isolation layer 142 may have the same thickness as the first device isolation layer 140. The second device isolation layer 142 separates the second active region ACT2 into a plurality of active sections 181. Specifically, the second device isolation layer 142 has the form of a grid. That is, the second isolation layer 142 has segments extending longitudinally in a first direction and a second direction intersecting the first direction. The first direction may be parallel to the lengthwise direction of the channel (i.e., in the direction of line M-M'). In the illustrated example, the width d2 of each segment of the second isolation layer 142 extending longitudinally in the widthwise direction of the channel (i.e., the dimension as measured in the lengthwise direction of the channel) is less than the width d1 of each segment of the first isolation layer 140.

Thus, in this example, the active sections 181 are in the form of protrusions exposed by the second device isolation layer 142, and the second electrode pattern 126 covers the active sections 181. The active sections 181 are shown as having a rectangular cross-sectional shape (in FIG. 32) but the inventive concept is not limited thereto.

In the fourth embodiment of a memory device according to the inventive concept, the boundary between the second device isolation layer 142 and the second active region ACT2 is relatively great in terms of its total length. This expands the above-described thinning phenomenon and hence gives rise to an increase in the capacitance that can be provided by the MOS capacitor.

Figure 35:
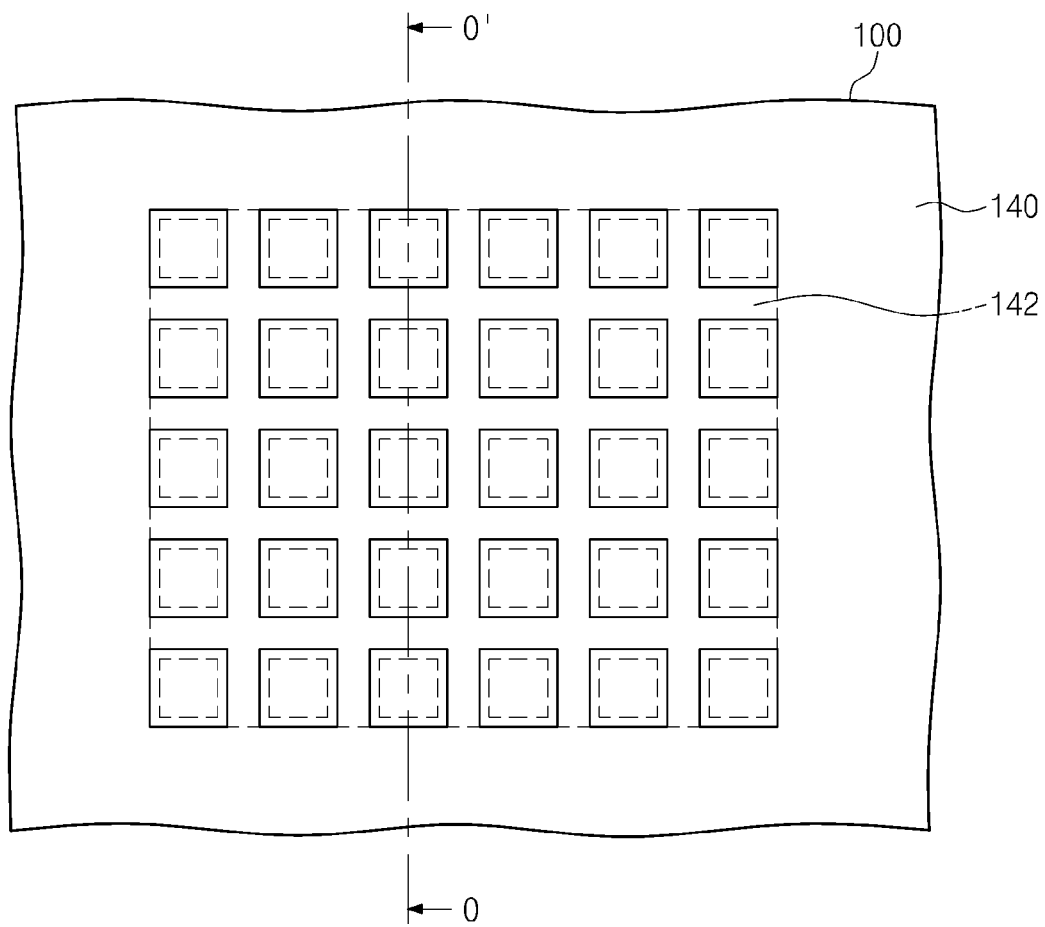

A method of forming the fourth embodiment of the memory device according to the inventive concept will now be described with reference to FIGS. 35 and 42. FIGS. 35, 37, 39, and 41 are views illustrating a method of forming the MOS capacitor in the plan view of FIG. 32. FIGS. 36, 38, 40, and 42 are sectional views taken along the line O-O' of FIG. 35. For conciseness, overlapping technical features will not be described.

Figure 36:
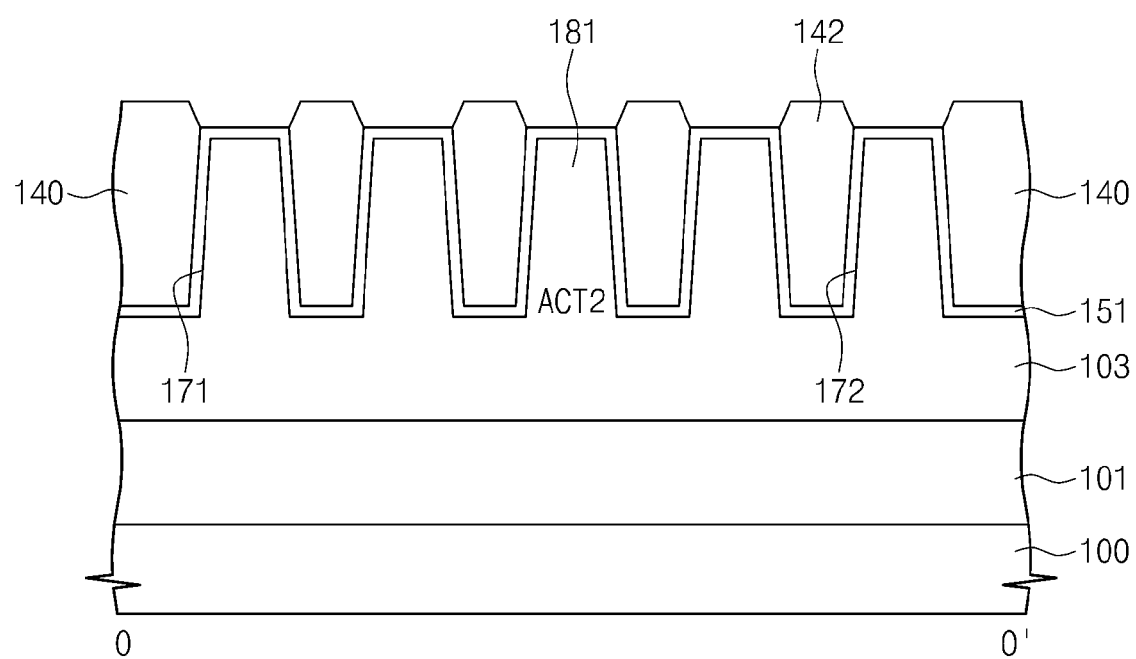

Referring to FIGS. 35 and 36, a first well 101 is formed in a substrate 100. The substrate 100 may be a silicon substrate, a germanium substrate, or a silicon-germanium substrate. The first well 101 is formed by doping part of the substrate with a second conductivity type impurity. As one example, the second conductivity type impurity is an n-type impurity and the substrate 100 is a structure doped with a p-type impurity (first conductivity type impurity). A third well 103 is formed in the first well 101. That is, the third well 103 may be a pocket well. The third well 103 is formed by doping a portion of the substrate 100 with an impurity of the first conductivity type. More specifically, the third well 103 may be formed by doping a portion of the substrate 100 several times with an impurity at respectively different concentrations.

A first device isolation layer 140 for defining the second active region ACT2 is formed in the substrate 100. The first device isolation layer 140 is formed by forming a first trench 171 in the substrate 100 and filling the trench 171 with insulating material. A second device isolation layer 142 for separating the second active region ACT2 into a plurality of active sections 181 is formed by forming second trenches 172 in the substrate and filling the second trenches 172 with insulation material. The first and second trenches 171 and 172 may be formed to the same depth. In this case, the first and second device isolation layers 140 and 142 have the same thickness. A liner insulation layer 151 may be formed on the substrate 100, including in the trenches 171 and 172, before the trenches 171 and 172 are filled. In particular, the liner insulation layer 151 may be an oxide layer formed through a thermal oxidation process.

The first and second device isolation layers 140 and 142 may be formed simultaneously. That is, the first and second trenches 171 and 172 may be formed simultaneously and the first and second trenches 171 and 172 may be filled with insulation material simultaneously. As was already described, the first and second device isolation layers 140 and 142 may be formed of a silicon oxide, especially, a silicon oxide formed through a high density plasma chemical vapor deposition method so as to have excellent gap-filling characteristics.

In this respect, the method is like that described above with respect to FIGS. 22 and 23. However, in this embodiment, the second trenches 172 and hence, the second device isolation layer 142 formed therein, have the shape of a grid. The resulting active sections 181 separated from each other by the grid have the form of pillars and may, as shown in the figures, have rectangular cross sections.

Figure 37:
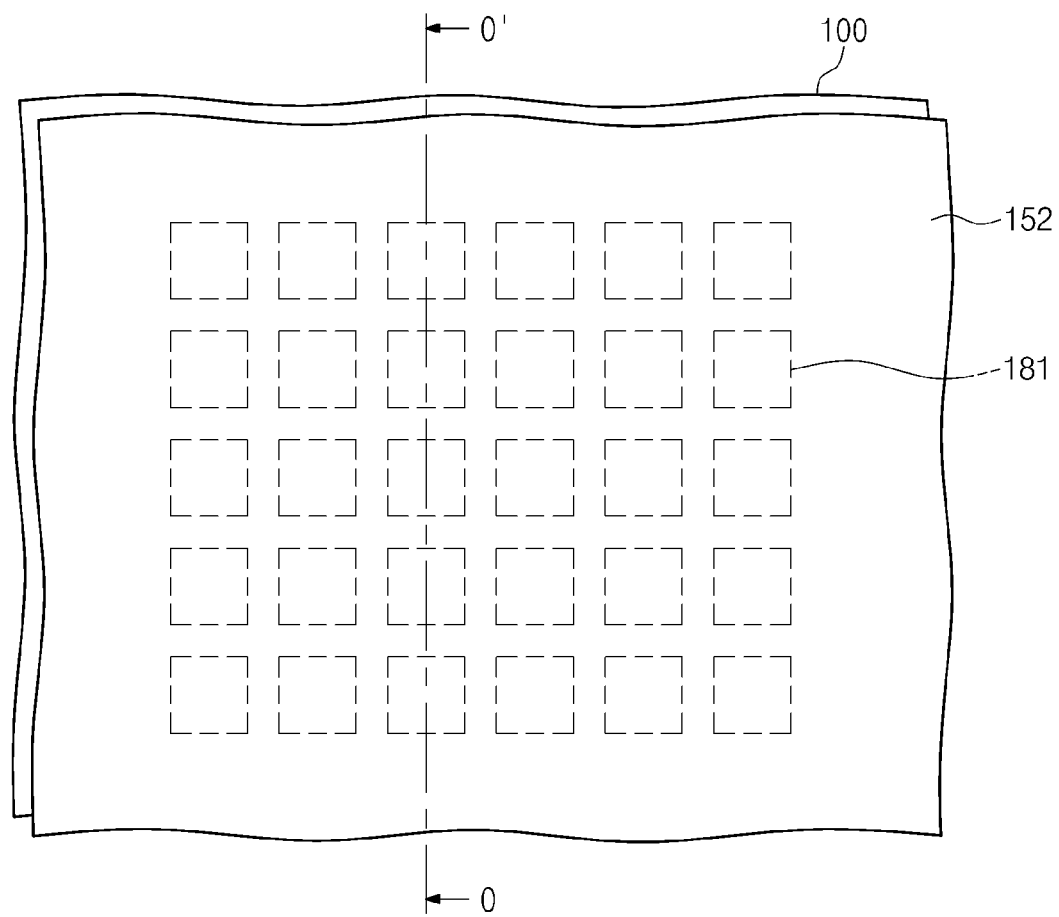
Figure 38:
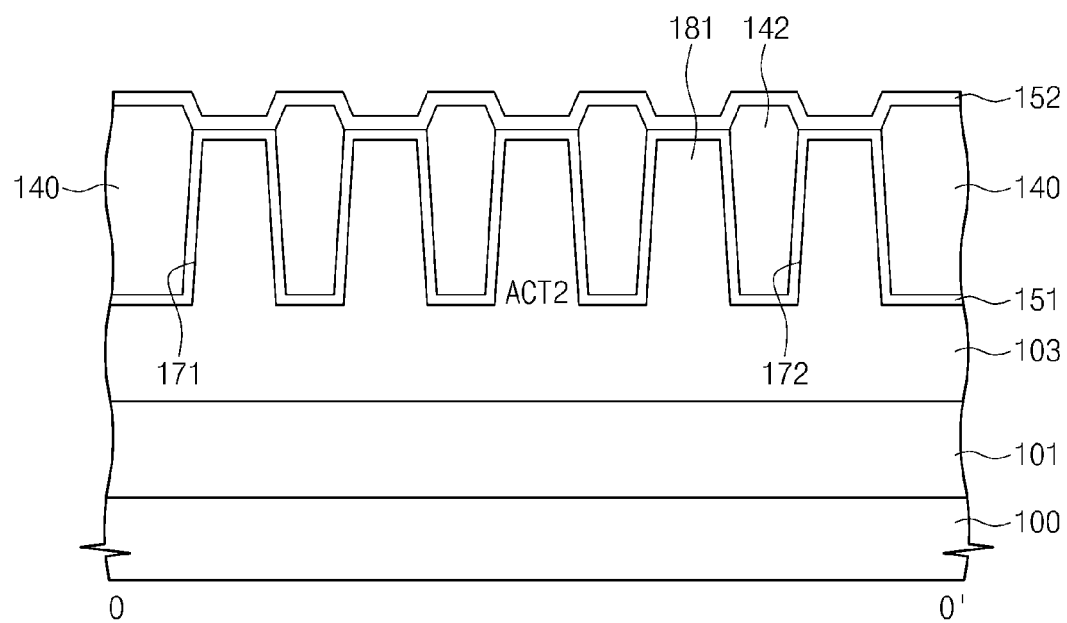

Referring to FIGS. 37 and 38, a first insulation layer 152 is formed on the substrate 100. The first insulation layer 152 may be used as a buffer insulation layer or an oxide layer of a logic device. As one example, transistors for various purposes such as low voltage (LV), medium voltage (MV), and high voltage (HV) are required during a DDI process and a thickness of each gate insulation layer may vary.

Figure 39:
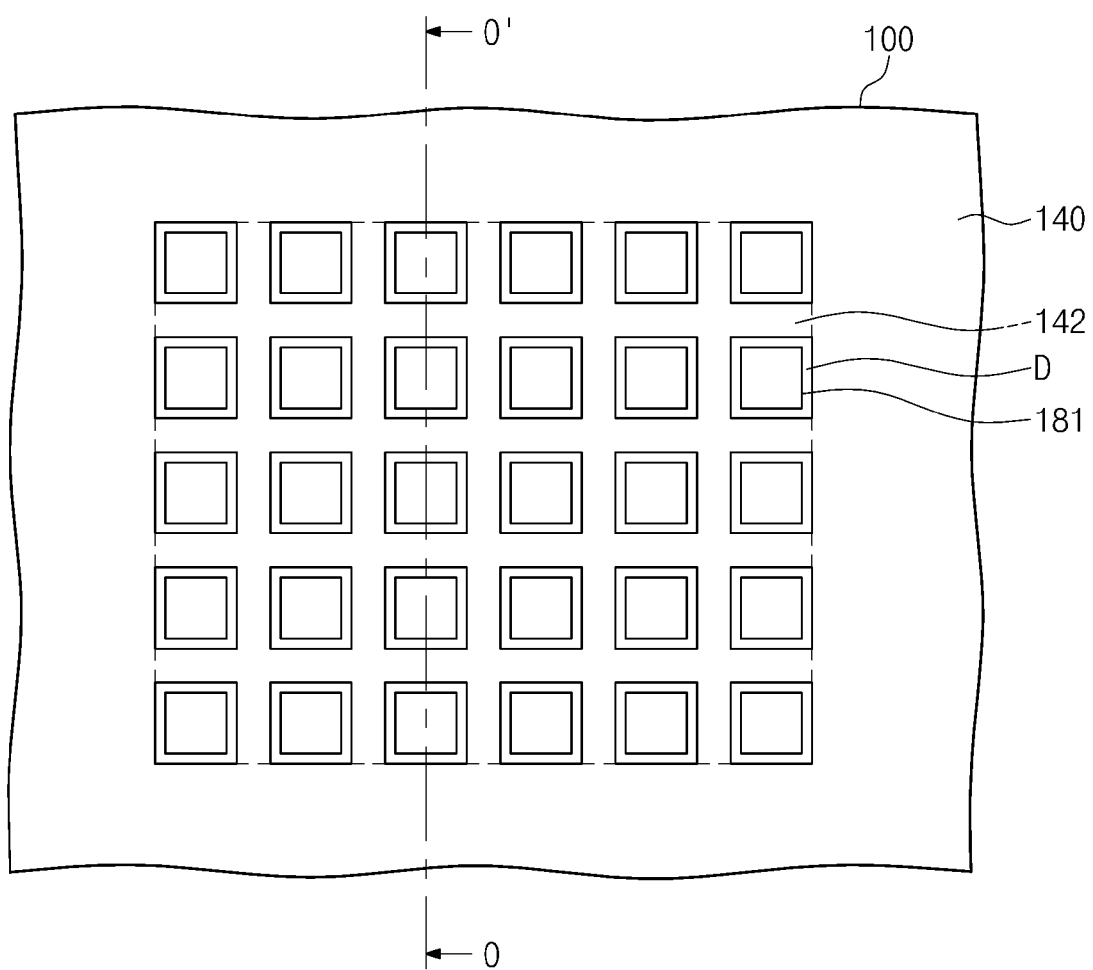
Figure 40:
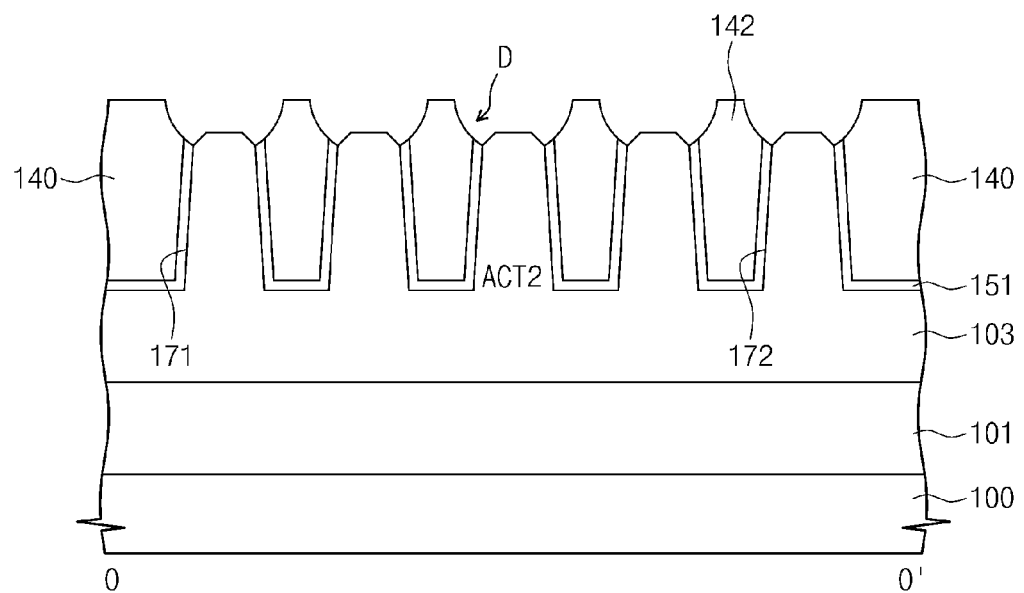

Referring to FIGS. 39 and 40, a portion of the liner insulation layer 151 and the first insulation layer 152 is removed to expose the tops of the active sections 181. This removal process may be a wet etching process. During the etching process, upper edges of the first and second device isolation layers 140 and 142 are removed such that indentations D are formed therein. In another example of this method, a portion of the first insulation layer 152 is left atop the first and second device isolation layers 140 and 141. In any case, the indentations D extend along the boundary between the first and second device isolation layers 140 and 142 and the active sections 181. Thus, the indentations D surround the active sections 181, respectively.

Figure 41:
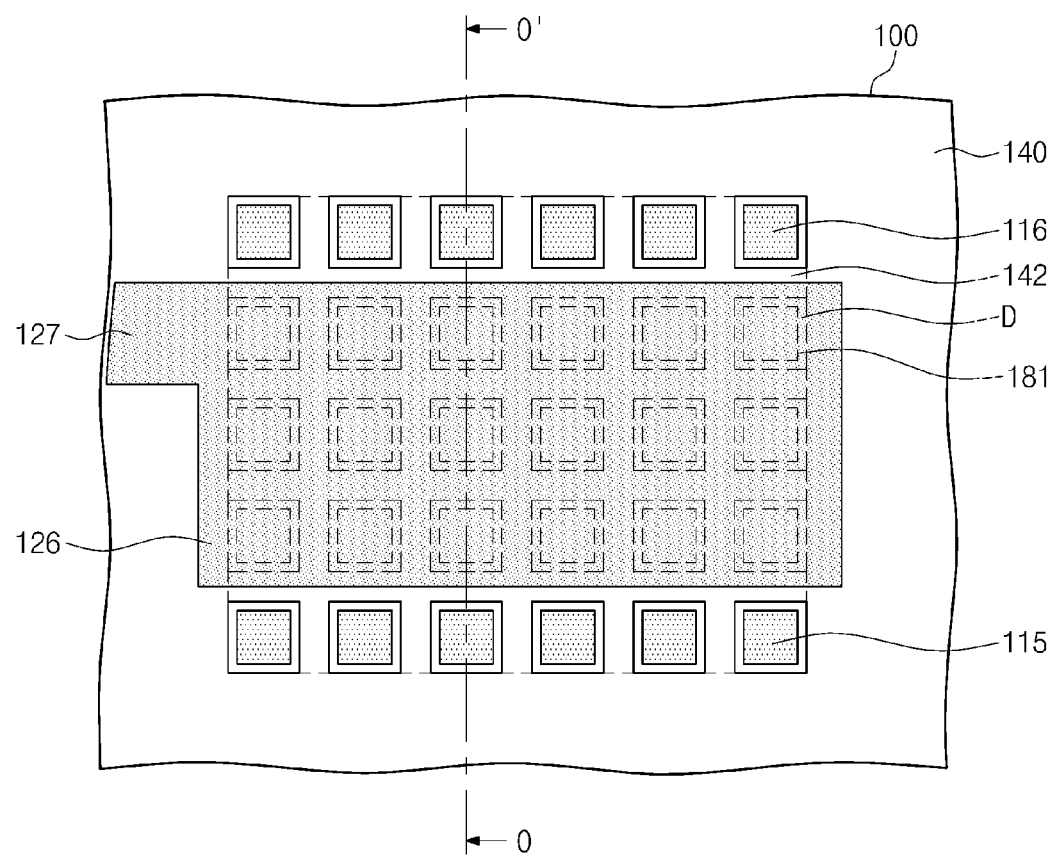
Figure 42:
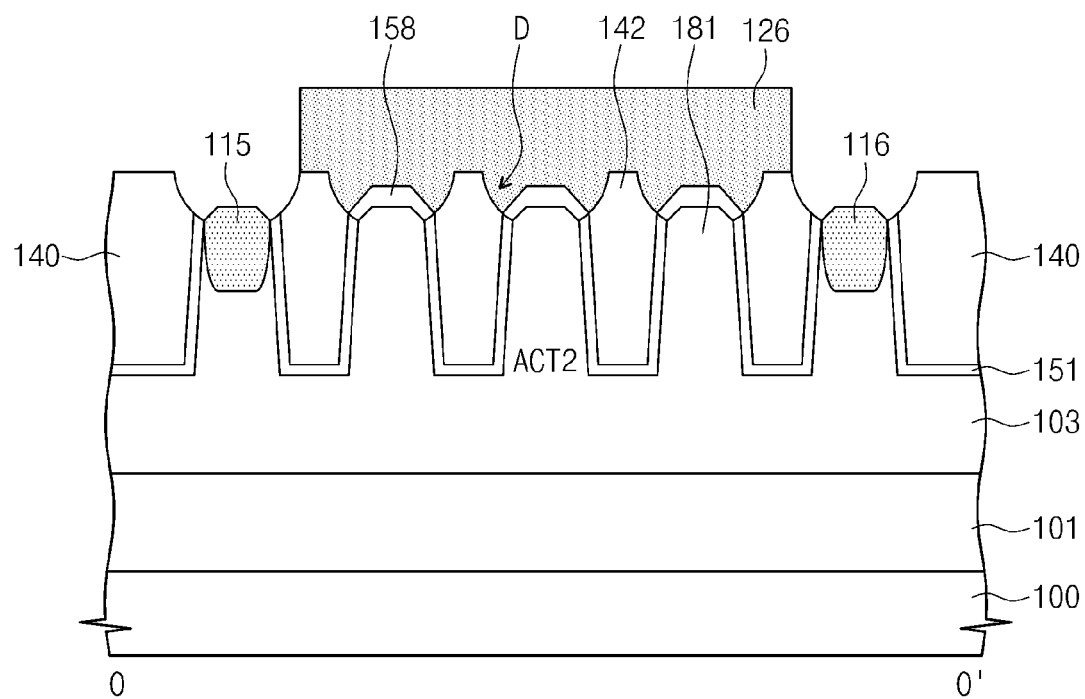

Referring to FIGS. 41 and 42, a capacitor insulation layer 158 is formed on the active sections 181 by a thermal oxidation process. The capacitor insulation layer 158 is formed to such a thickness that the top surface of the capacitor insulation layer 158 is disposed at a level lower than that of the second device isolation layer 142. Also, a portion of the capacitor insulation layer 158 may overlap the liner insulation layer 151 or the second device isolation layer 142. For the reasons described above, edge thinning occurs along the periphery of each portion of the capacitor insulation layer 158 disposed atop an active section 181 of the second active region ACT2.

A conductive layer (not shown) is formed on the capacitor insulation layer 158, and the conductive layer is patterned to form second electrode pattern 126 on the capacitor insulation layer 158. Electrode connection pattern 127 for connecting the second electrode pattern 126 with the first electrode pattern 125 may be formed by this patterning process, as well.

Furthermore, in this example, the second electrode pattern 126 exposes the capacitor insulation layer 158 at opposite sides of the second electrode pattern 126 in the widthwise direction of the channel, i.e., exposes the portions of the capacitor insulation layer 158 on the active sections 181 exposed by the second electrode pattern 126. Those exposed portions of the capacitor insulation layer 158 are removed. Then a fifth impurity region 115 and a sixth impurity region 116 are formed at the active sections 181, respectively, from which the capacitor insulation layer 158 was removed. The fifth and sixth impurity regions 115 and 116 are formed by doping the first and second ends of the active sections 181 with impurities of different conductivity types, respectively. In another example of this embodiment, only one of the fifth and sixth impurity regions 115 and 116 is formed. Then, a silicide layer (not shown), e.g., a cobalt silicide layer, may be formed on the first to seventh impurity regions 111 to 117.

Figure 43:
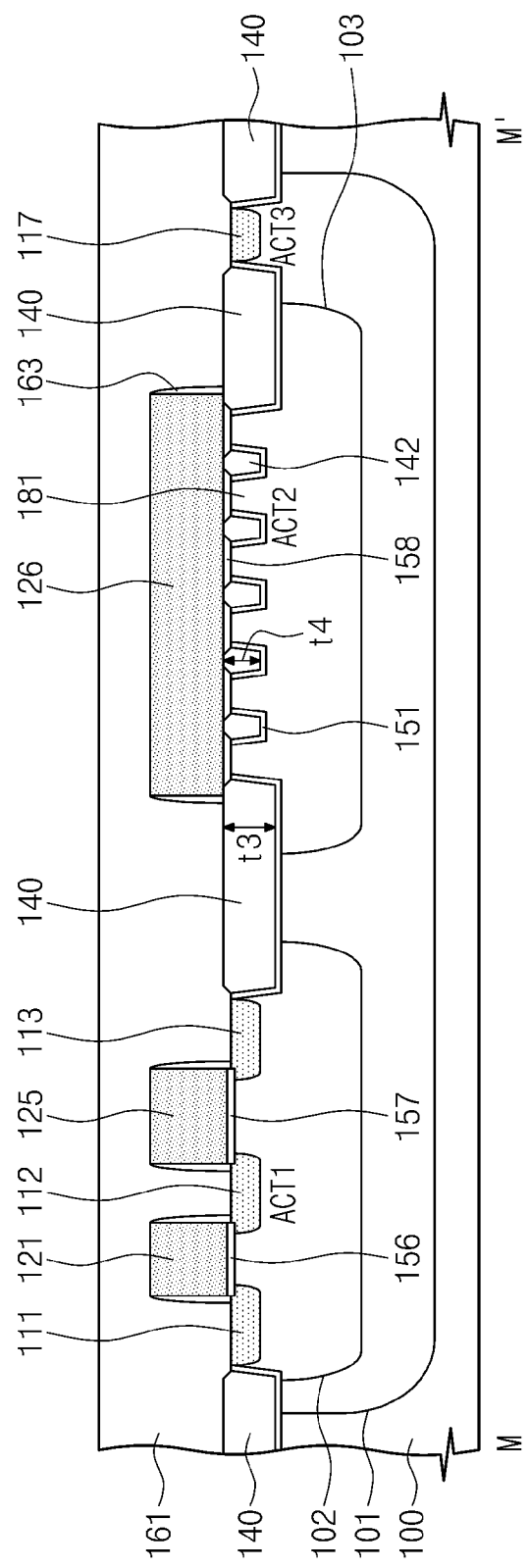
FIGS. 43 and 44 are sectional views illustrating another version of a method of forming the fourth embodiment of a semiconductor memory device, according to the inventive concept.
Figure 44:
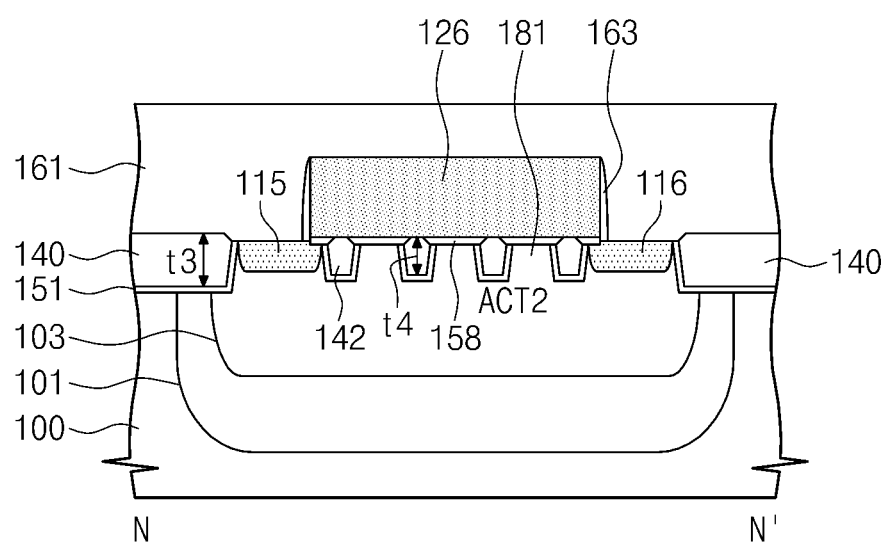

Another version of the fourth embodiment of a memory device according to the inventive concept is shown in FIGS. 43 and 44.

In this version, the thickness t4 of the second device isolation layer 142 is greater than the thickness t3 of the first device isolation layer 140. The distance from the top surface of the substrate 100 to the bottom surface of the second device isolation layer 142 is also less than the distance from the top surface of the substrate 100 to the bottom surface of the first device isolation layer 140. The first and second device isolation layers 140 and 142 may be formed by forming a plurality of trenches of different depths, and then simultaneously filling the trenches. Alternatively, the first device isolation layer 140 may be formed, and then second trenches are formed and filled to form the second device isolation layer 142. The thickness of the second device isolation layer 142 may be selected to maximize the capacitance.

Memory devices according to the inventive concept may be packaged in various ways. For example, semiconductor memory devices according to the inventive concept may be packaged in a Package on Package (PoP), Ball Grid Array (BGA) package, Chip Scale Package (CSP), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), and Wafer-level Processed Stack Package (WSP). A package in which a semiconductor memory device according to the inventive concept is mounted may also include a controller for controlling the semiconductor memory device and/or a logic device.

Figure 45:
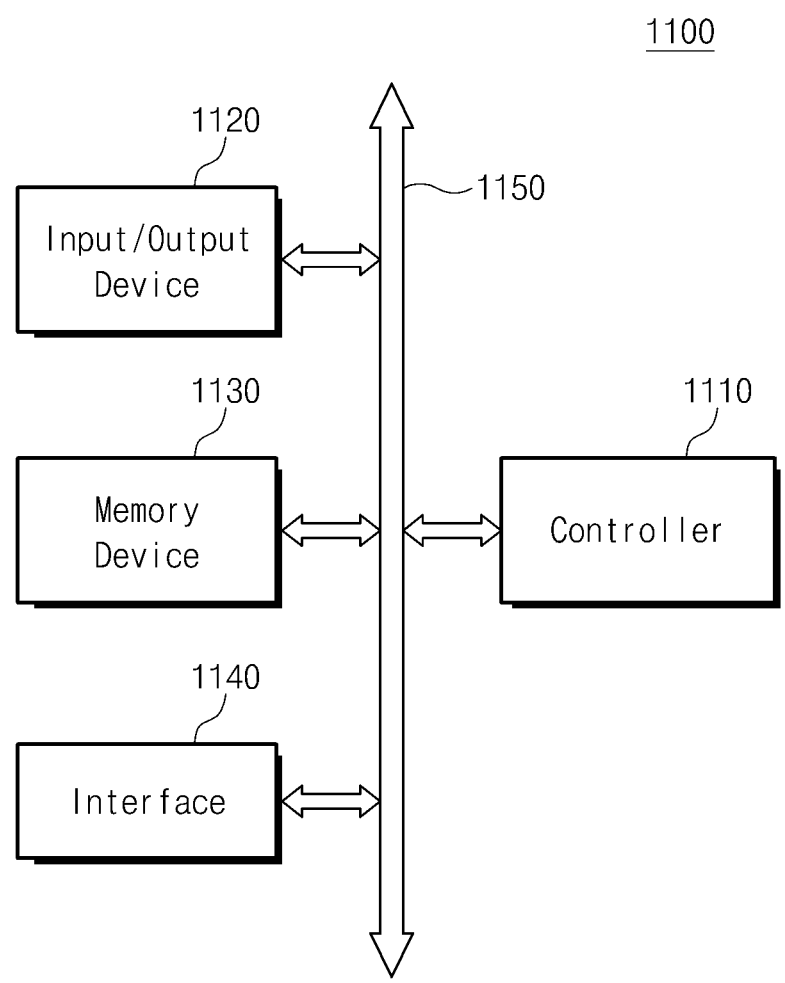
FIG. 45 is a block diagram of an electronic system including a semiconductor memory device according to the inventive concept.

FIG. 45 is a block diagram illustrating an electronic system including a semiconductor memory device according to the inventive concept.

Referring to FIG. 45, the electronic system 1100 includes a controller 1110, an input/output device (or I/O) 1120, a memory device 1130, an interface 1140, and a bus 1150. The controller 1110, the input/output device 1120, the memory device 1130, and/or the interface 1140 communicate through the bus 1150. That is, the bus 1150 forms a path along which data or a command signal is transferred.

The controller 1110 may include at least one micro processor, digital signal processor, micro controller, or other processors similar thereto. The input/output device 1120 may comprise a keypad, a keyboard, and a display device. The memory device 1130 may store data and/or commands. The memory device 1130 includes at least one of the semiconductor devices according to the inventive concept. Moreover, the memory device 1130 may further include at least one other type of semiconductor memory device (e.g., a DRAM device and/or an SRAM device). The interface 1140 serves to transmit or receive data to or from a communication network. To this end, the interface 1140 may have a wire or wireless form. For example, the interface 1140 may include an antenna or a wire/wireless transceiver. Although not shown in the drawings, the electronic system 1100 may further include a high-speed DRAM and/or SRAM as an operating memory for improving the operation of the controller 1110.

The electronic system 1100 may employed by a PDA, a portable computer, a web tablet, a cordless phone, a mobile phone, a digital music player, a memory card, or various other devices for transmitting and receiving information via a wireless environment.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A nonvolatile memory device, comprising:
a substrate;
a device isolation layer in the substrate that delimits a first active region and a second active region in the substrate;
a Metal Oxide Silicon Field-Effect Transistor (MOSFET) disposed at the first active region and including a tunnel insulation layer, and a first electrode pattern that is narrower in the widthwise direction of the channel of the MOSFET than the first active region; and
a Metal Oxide Silicon (MOS) capacitor disposed at the second active region,
wherein a bottom surface of the tunnel insulation layer is disposed at a level beneath a top surface of the substrate.

2. A nonvolatile memory device comprising:
a substrate;
a device isolation layer in the substrate and delimiting a first active region and a second active region in the substrate;
a Metal Oxide Silicon Field-Effect Transistor (MOSFET) disposed at the first active region and including a first electrode pattern; and
a Metal Oxide Silicon (MOS) capacitor disposed at the second active region and including a second electrode pattern,
wherein the first electrode pattern is narrower, in the widthwise direction of the channel of the MOSFET, than the first active region,
wherein the device isolation layer has indentations in upper edges thereof spaced in the lengthwise direction of the channel of the MOSFET and confronting upper portions of sidewalls of the first active region and the second active region.

3. The nonvolatile memory device of claim 2, wherein the MOS capacitor comprises a capacitor insulation layer, and the thickness of a first portion of the capacitor insulation layer confronted by one of the indentations is less than that of a second portion of the capacitor insulation layer extending along the top surface of the second action region.

4. A nonvolatile memory device comprising:
a substrate;
a device isolation layer in the substrate and delimiting a first active region and a second active region in the substrate;
a Metal Oxide Silicon Field-Effect Transistor (MOSFET) disposed at the first active region and including a first electrode pattern; and
a Metal Oxide Silicon (MOS) capacitor disposed at the second active region and including a second electrode pattern,
wherein the first electrode pattern is narrower, in the widthwise direction of the channel of the MOSFET, than the first active region,
wherein the device isolation layer delimits a third active region in the substrate, and
the device has a first well and a second well disposed in the substrate, as spaced apart from each other, the first active region and the third active region being disposed in the first well, and the second active region being disposed in the second well.

5. A nonvolatile memory device comprising:
a substrate;
a device isolation layer in the substrate and delimiting a first active region and a second active region in the substrate;
a Metal Oxide Silicon Field-Effect Transistor (MOSFET) disposed at the first active region and including a first electrode pattern; and
a Metal Oxide Silicon (MOS) capacitor disposed at the second active region and including a second electrode pattern, and a capacitor insulation layer having a bottom surface disposed at a level beneath a top surface of the substrate,
wherein a thickness of a first portion of the capacitor insulation layer proximate the device isolation layer is less than a thickness of a second portion of the capacitor insulation layer extending along a top surface of the second active region.

* * * * *